(12) United States Patent
Aoki et al.

(10) Patent No.: US 7,810,052 B2
(45) Date of Patent: Oct. 5, 2010

(54) METHOD AND APPARATUS FOR SUPPORTING IC DESIGN, AND COMPUTER PRODUCT

(75) Inventors: Katsushi Aoki, Kawasaki (JP); Junya Yamasaki, Kawasaki (JP); Hiroki Murakami, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 588 days.

(21) Appl. No.: 11/785,897

(22) Filed: Apr. 20, 2007

(65) Prior Publication Data
US 2008/0028356 A1 Jan. 31, 2008

(30) Foreign Application Priority Data
Jul. 27, 2006 (JP) .............................. 2006-205259

(51) Int. Cl.
*G06F 17/50* (2006.01)
(52) U.S. Cl. ........................................................ 716/1
(58) Field of Classification Search ..................... 716/1
See application file for complete search history.

(56) References Cited

U.S. PATENT DOCUMENTS 5,946,478 A * 8/1999 Lawman ....................... 716/17
7,093,229 B2 * 8/2006 Pang et al. .................... 716/21
2004/0003366 A1 1/2004 Suzuki
2008/0028347 A1 * 1/2008 Hiraoglu et al. ................. 716/5

FOREIGN PATENT DOCUMENTS

| JP | 03-088073 | 4/1991 |
| JP | 5-165908 | 7/1993 |
| JP | 2001-256264 | 9/2001 |

OTHER PUBLICATIONS

Patent Abstract of Japan, Japanese Publication No. 2004-030308, Published Jan. 29, 2004.[1].

* cited by examiner

*Primary Examiner*—Jack Chiang
*Assistant Examiner*—Brandon W Bowers
(74) *Attorney, Agent, or Firm*—Staas & Halsey LLP

(57) ABSTRACT

A logical-group creating unit creates a logical group from a cell included in a selected range of a logical drawing that is specified in a logical page. A logical-group extracting unit extracts a same/similar logical group by determining whether logical drawings of created logical groups are same or similar to each other. A pattern creating unit creates an implementation pattern of a logical group included in extracted same/similar logical group.

22 Claims, 19 Drawing Sheets

FIG.4

| LOGICAL DRAWING NAME | LOGICAL PAGE NAME | LOCATION INFORMATION | I/O INFORMATION | INSTANCE INFORMATION | PIN INFORMATION | NET INFORMATION |
|---|---|---|---|---|---|---|
| LOGICAL DRAWING 1 | LOGICAL PAGE 1 | (1, 1) | ⋮ | ⋮ | ⋮ | ⋮ |
| | LOGICAL PAGE 2 | (6, 1) | ⋮ | ⋮ | ⋮ | ⋮ |
| | LOGICAL PAGE 3 | (6, -3) | ⋮ | ⋮ | ⋮ | ⋮ |
| | ... | ... | ... | ... | ... | ... |
| ... | ... | ... | ... | ... | ... | ... |

TYPICAL LOGICAL GROUP

LOGICAL GROUP EXACTLY MATCHING TYPICAL LOGICAL GROUP
(LOCATION, CONNECTION RELATIONSHIP,
MACRO TYPE, AND DESTINATION)

SINGLE MISMATCH
MISMATCH IN LOCATION

MISMATCH IN CONNECTION RELATIONSHIP

MISMATCH IN MACRO TYPE

MISMATCH IN DESTINATION

MULTIPLE MISMATCHES
MISMATCHES IN LOCATION AND CONNECTION RELATIONSHIP

MISMATCHES IN LOCATION AND MACRO TYPE

MISMATCHES IN MACRO TYPE AND DESTINATION

FIG.6

| LOGICAL GROUP NAME | IMPLEMENTATION PATTERN NAME | LAYOUT LOCATION | | | | | |
|---|---|---|---|---|---|---|---|
| | | No. | CO-ORDINATES | INSTANCE (CELL) NAME | | DESTINATION INSTANCE No | INTER-CELL DISTANCE |
| | | | | PAGE NAME | LOCATION NAME | | |
| LOGICAL GROUP 10 | IMPLEMENTATION PATTERN 11 | 1 | (1, 1) | 00A | 11 | 2 | 1 |
| | | 2 | (2, 1) | 00A | 12 | 5 | √2 |
| | | 3 | (1, 2) | 00A | 13 | 4 | 1 |
| | | 4 | (2, 2) | 00A | 14 | 5 | 1 |
| | | 5 | (3.5, 2) | 00A | 15 | 6 | 1 |
| | | 6 | (5, 2) | 00A | 16 | - | - |
| | | ... | ... | ... | | ... | ... |
| | IMPLEMENTATION PATTERN 12 | ... | ... | ... | | ... | ... |
| | IMPLEMENTATION PATTERN 13 | ... | ... | ... | | ... | ... |
| ... | ... | ... | ... | ... | | ... | ... |

LAYOUT LOCATION OF EACH INSTANCE (CELL)

DISTANCE INFORMATION BETWEEN INSTANCES (CELLS) IN LOGICAL GROUP HAVING CONNECTION RELATIONSHIP

| LOGICAL GROUP NAME | TOTAL NUMBER OF CELLS | INTRA-GROUP INSTANCE INFORMATION | NET INFOR-MATION | HIERARCHICAL INFORMATION |
|---|---|---|---|---|
| LOGICAL GROUP 10 | 15 | INSTANCE 11 | A | LOGICAL GROUP 20 |
| | | INSTANCE 12 | B | LOGICAL GROUP 30 |
| | | INSTANCE 13 | C | |
| | | ⋮ | ⋮ | ⋮ |
| ⋮ | ⋮ | ⋮ | ⋮ | ⋮ |

LOGICAL GROUP

IMPLEMENTATION PATTERN CREATED ACCORDING TO LOCATIONS WHERE CELLS ARE DISPLAYED IN LOGICAL GROUP

IMPLEMENTATION PATTERN CREATED ALLOWING FOR LAYOUT SPACE AND WIRING CAPABILITY

METHOD AND APPARATUS FOR SUPPORTING IC DESIGN, AND COMPUTER PRODUCT

CROSS REFERENCE TO RELATED APPLICATIONS

The present application is based on Japanese Priority Patent Application No. 2006-205259, filed Jul. 27, 2006, the entire contents of which are hereby incorporated by reference.

BACKGROUND OF THE INVENTION

1. Field of the Invention

The present invention relates to a technology for supporting design of a drawing for implementing an IC based on logical drawings.

2. Description of the Related Art

An integrated circuit (IC) design support program has conventionally been used to support design for large scale and complicated ICs such as Large Scale Integration (LSI). The IC design support program allows efficient IC design by automated design in such a manner that cells being logic gates forming the IC are arranged to be automatically interconnected to each other.

Recently, higher-speed performance of more complicated processes has been demanded of the IC such as LSI, but the IC automatically designed by the IC design support program cannot exhibit the demanded performance. To meet the demand, for example, Japanese Patent Application Laid-Open No. H3-88073 discloses a layout editor to support the IC design capable of manually correcting a pattern of the automatically designed IC.

As explained above, manually operated design is still important for the design of the IC. To support the manually operated design, for example, Japanese Patent Application Laid-Open No. 2004-30308 discloses a method of creating a layout for IC design. The method is such that a circuit pattern, which is generally hierarchized with several layers, is two-dimensionally displayed on one plane to achieve improved visibility, and that a cell pattern is copied to obtain one with the same structure, to enable elimination of work redundancy.

Japanese Patent Application Laid-Open No. H5-165908 discloses a drawing editor that creates a macro of part of a manually created circuit drawing, uses a macro symbol as the created macro to enable creation of a higher hierarchical drawing, and that reduces human error such that part of the manually created circuit drawing does not match a higher hierarchical drawing created using the manually created circuit drawing. Furthermore, Japanese Patent Application Laid-Open No. 2001-256264 discloses a board-design support device capable of checking a difference between a board specification such as wiring information for a registered block which is previously registered and a board specification of a circuit block which is an object to be designed, converting the board specification of the registered block so as to match the board specification required for the circuit block, and using the converted board specification for setting of the board specification such as wiring information for the circuit block to be designed.

In the conventional technologies, however, when cells are manually arranged and adjusted during designing of the IC, a cell to be arranged is selected from a list. Therefore, checking logical connections of enormous amounts of cells still causes a large number of processes to be produced. When design work in particular requires many processes and if correction of the work occurs in an upstream process thereof when the work has proceeded up to a downstream process thereof, the work needs to go back all the way to the upstream process where the correction occurs.

More specifically, in the conventional technologies, a copy or a macro of a cell pattern having the same structure is created, and by using the copy or the macro, work redundancy can be eliminated. However, when cells are to be manually arranged or adjusted, the cells are selected from a list, and this may cause error in selection, which leads to reduction in work efficiency.

In the conventional technology represented by Japanese Patent Application Laid-Open No. H3-88073, the logical drawing is displayed when cells are manually arranged or adjusted, and this allows selection of an object to be implemented while checking the logical connection, but the displayed logical drawing is only one.

SUMMARY OF THE INVENTION

It is an object of the present invention to at least partially solve the problems in the conventional technology.

A computer-readable recording medium according to one aspect of the present invention stores therein a computer program for supporting a design of an implementation drawing of an integrated circuit based on a logical drawing in which a cell is included in units of logical page. The computer program causes a computer to execute creating a logical group from the cell included in a selected range of the logical drawing that is specified in the logical page; extracting a same/similar logical group by determining whether logical drawings of created logical groups are same or similar to each other; and creating an implementation pattern of a logical group included in extracted same/similar logical group.

An apparatus according to another aspect of the present invention is for supporting a design of an implementation drawing of an integrated circuit based on a logical drawing in which a cell is included in units of logical page. The apparatus includes a logical-group creating unit that creates a logical group from the cell included in a selected range of the logical drawing that is specified in the logical page; a logical-group extracting unit that extracts a same/similar logical group by determining whether logical drawings of created logical groups are same or similar to each other; and a pattern creating unit that creates an implementation pattern of a logical group included in extracted same/similar logical group.

A method according to still another aspect of the present invention is for supporting a design of an implementation drawing of an integrated circuit based on a logical drawing in which a cell is included in units of logical page. The method includes creating a logical group from the cell included in a selected range of the logical drawing that is specified in the logical page; extracting a same/similar logical group by determining whether logical drawings of created logical groups are same or similar to each other; and creating an implementation pattern of a logical group included in extracted same/similar logical group.

The above and other objects, features, advantages and technical and industrial significance of this invention will be better understood by reading the following detailed description of presently preferred embodiments of the invention, when considered in connection with the accompanying drawings.

BRIEF DESCRIPTION OF THE DRAWINGS

FIG. 6 is a diagram for explaining information contained in implementation pattern information;

FIGS. 15A-1 to 15B-3 are diagrams for explaining an outline of how to arrange implementation patterns.

DETAILED DESCRIPTION OF THE PREFERRED EMBODIMENTS

Exemplary embodiments of the present invention are explained in detail below with reference to the accompanying drawings. In the embodiments, an IC is applied to LSI, but the IC can also be applied to other ICs.

Figures 1, 1A:
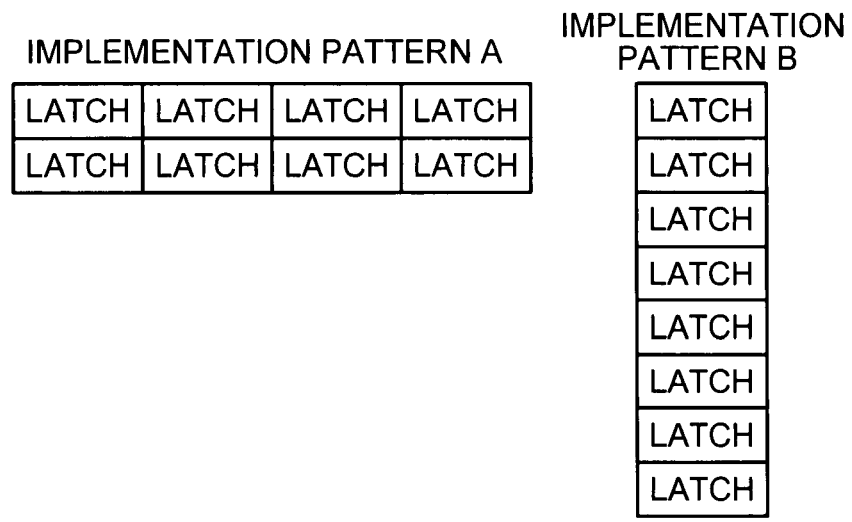
FIGS. 1A-1 to 1B-2 are diagrams for explaining features of the present invention.

FIGS. 1A-1 to 1B-2 are diagrams for explaining features of the present invention. As shown in FIG. 1A-1, a first feature of the present invention is to previously create implementation patterns such as an implementation pattern A and an implementation pattern B corresponding to respective macros obtained by combining a plurality of cells (logic gates). Specifically, the implementation pattern A is such that an array of Latches which are a kind of macro is arranged in two rows and four columns, and the implementation pattern B is such that an array of Latches is arranged in eight rows and one column. A visual list of the macros or implementation patterns corresponding to the macros is displayed on a Graphical User Interface (GUI) in a predetermined display unit of an IC design support apparatus according to the present invention. A macro or an implementation pattern is selected from the displayed list to create an instance by which the macro is embodied, and an implementation pattern corresponding to the instance can be manually arranged in an implementation drawing as it is without changing its shape.

The previously created implementation patterns are layout patterns of the macros created according to each logical group contained in match/similar logical groups, into which each logical group selected from an input drawing is classified according to the matching or the similarity.

Figures 1, 1A, 2:
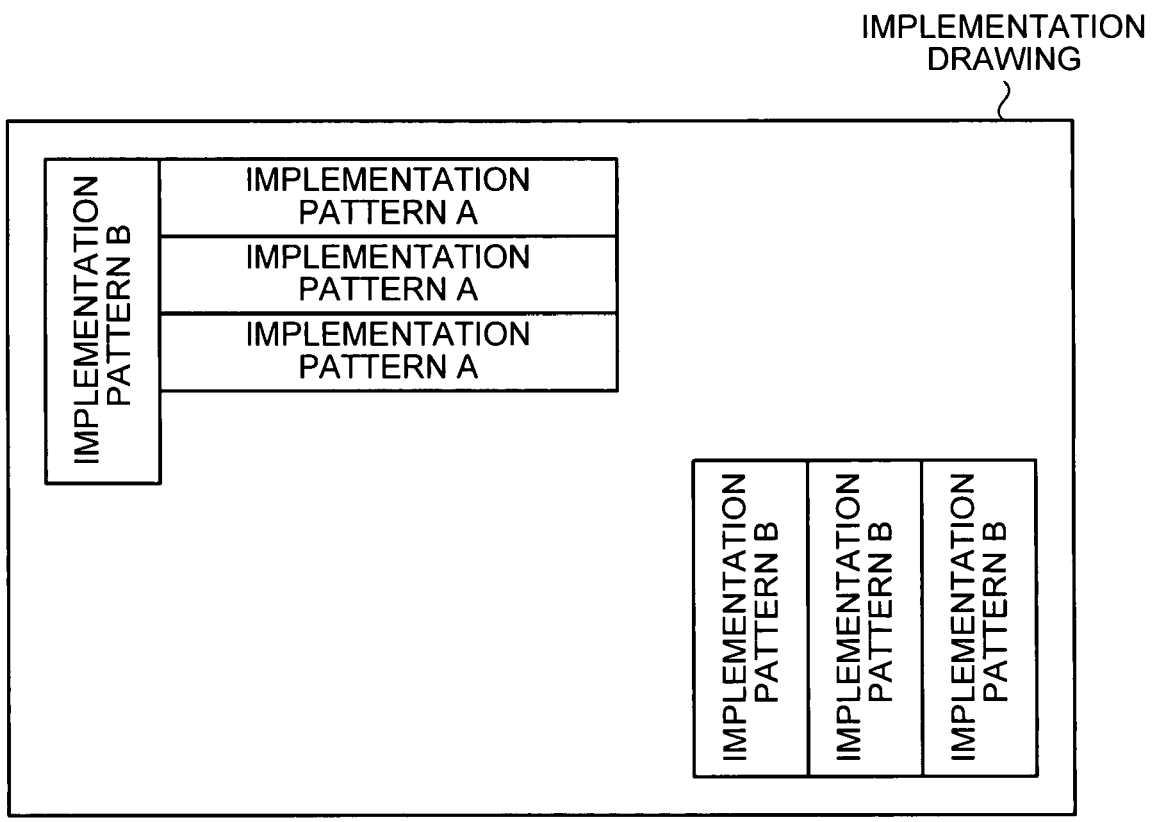
Figures 1, 1B:
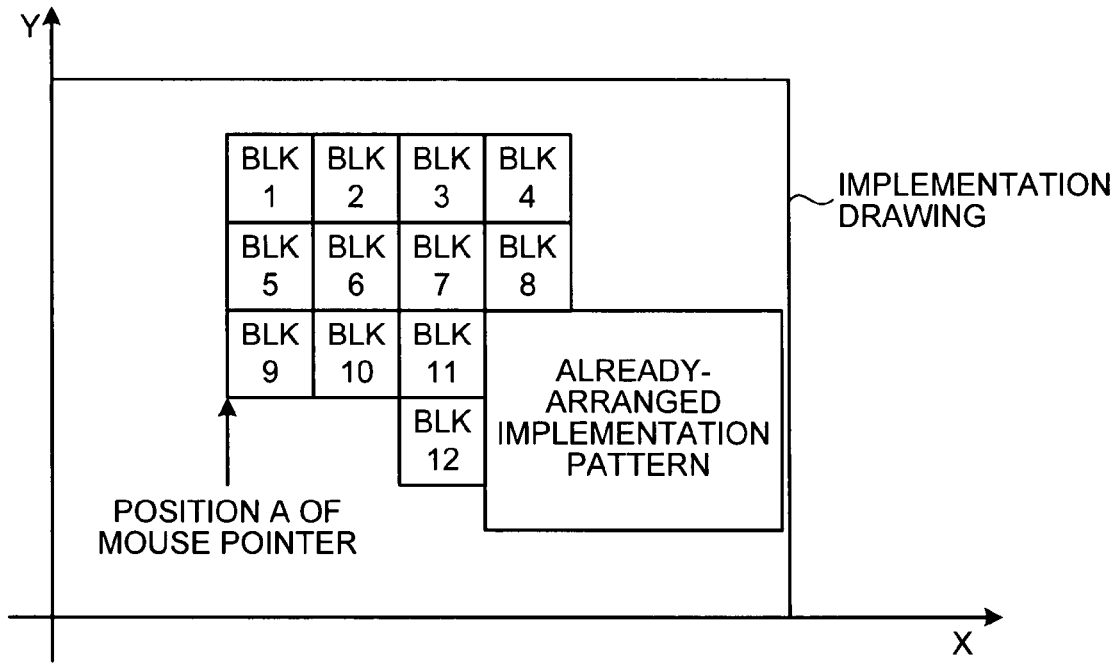
Figures 1, 1B, 2:
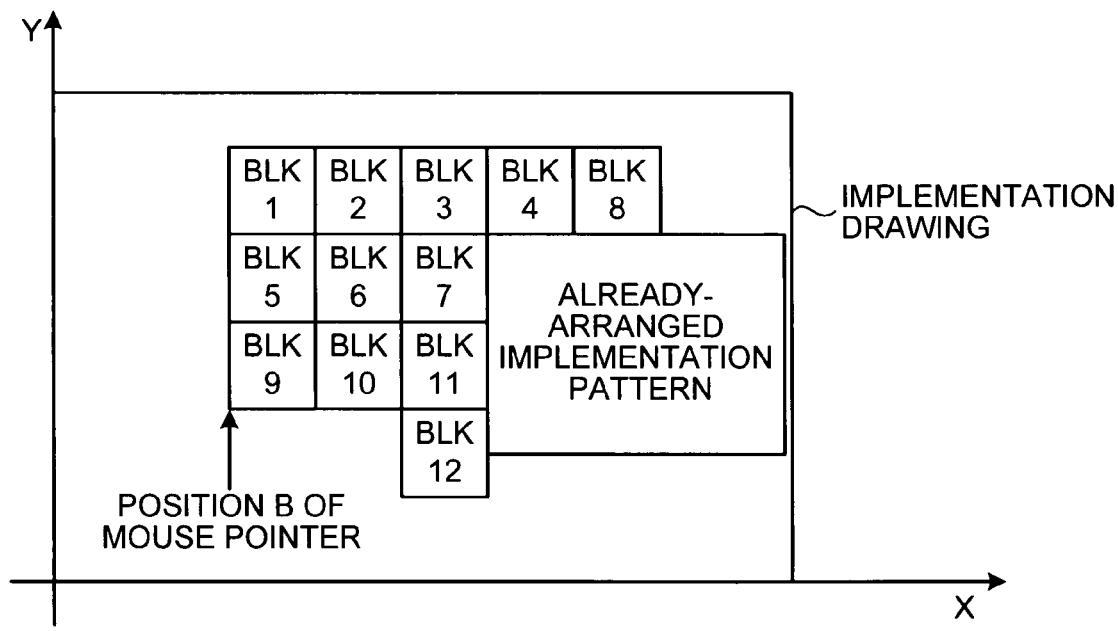

A second feature of the present invention enables a shape to be changed as shown in FIGS. 1B-1 and 1B-2. More specifically, a macro has cells (each called "BLK" as block in the figures) including BLK 1 to BLK 12 arranged in three rows and four columns, and the macro is selected. The shape of an implementation pattern corresponding to an instance of the selected macro can be changed in such a manner that graphical overlap with the already-arranged implementation pattern is avoided, depending on cases where a layout location of the implementation pattern is located at a position A of a mouse pointer or at a position B thereof. In other words, the shape of the implementation pattern to be arranged can be dynamically customized according to drag or change of a mouse pointer position.

The embodiments of the present invention are explained below with reference to FIG. 2A to FIG. 15B-3. An outline for selecting a cell from a logical page is explained below with reference to FIGS. 2A to 2C. The logical page mentioned here indicates a design drawing separated as each page that forms a logical drawing, which is input drawing information in the IC design support program, the IC design support apparatus, and an IC design support method according to one embodiment. The logical group is a macro obtained by selecting a range to make a plurality of cells in the range as a group.

Figure 2A:
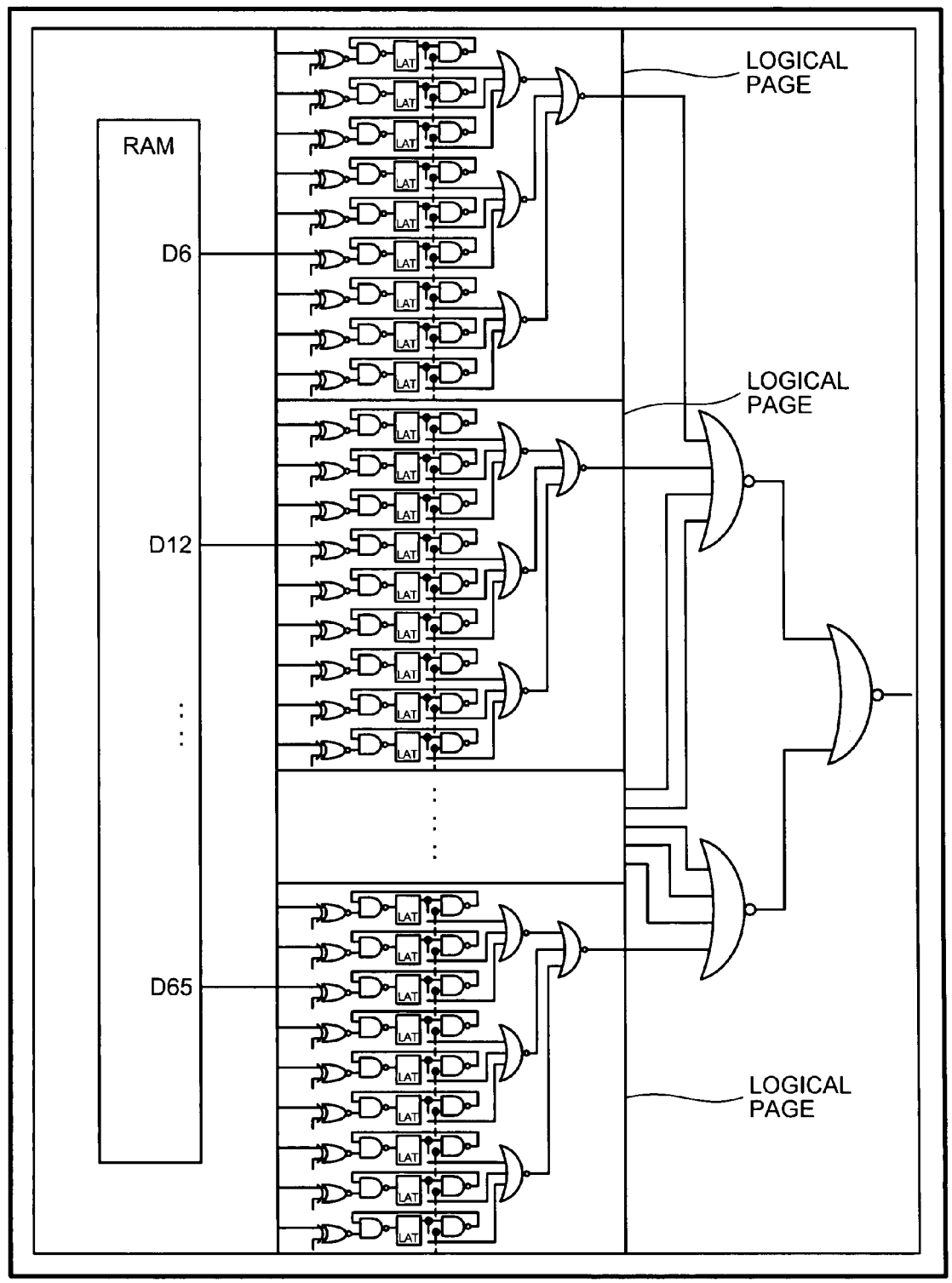
FIG. 2A is a diagram of an outline for selecting all the cells in a plurality of logical pages as a logical group.

FIG. 2A is a diagram of an outline for selecting all the cells in a plurality of logical pages as a logical group. In the IC design support program, the IC design support apparatus, and the IC design support method according to the embodiment, a first process is to select all the logical pages two-dimensionally expressed in one layer as a logical group. Alternatively, the first process is to select all the logical pages expressed in a plurality of layers as a logical group.

Figure 2B:
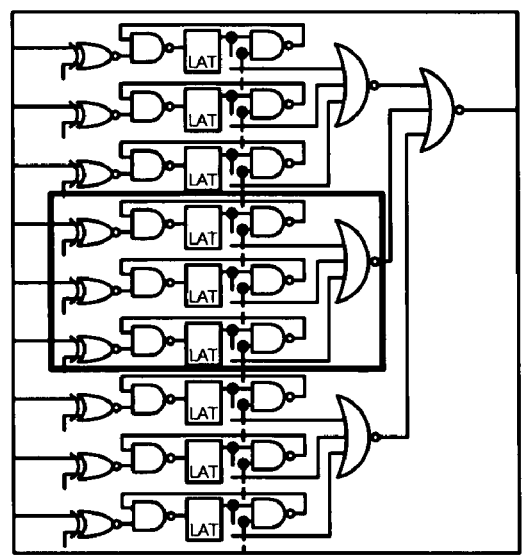
FIG. 2B is a diagram of an outline for selecting part of cells in a single logical page as a logical group.
Figure 2C:
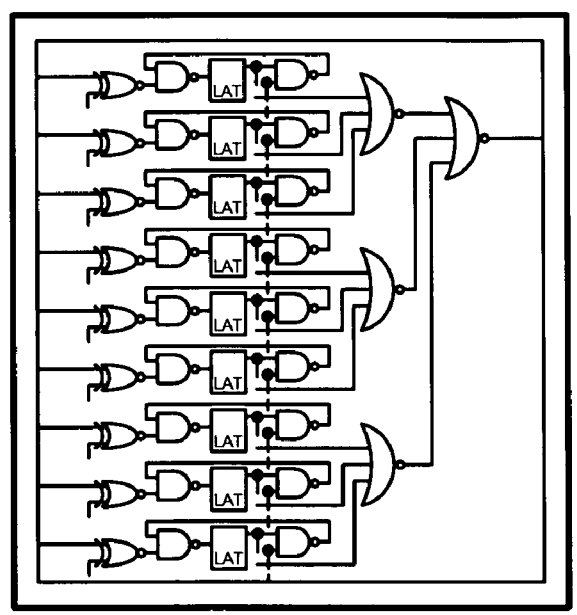
FIG. 2C is a diagram of an outline for selecting all the cells in a single logical page as a logical group.

As shown in FIG. 2B, partial cells in a single logical page, i.e., a combination of partial cells in a single logical page may also be selected as a logical group. As shown in FIG. 2C, all the cells in a single logical page may also be selected as a logical group. The logical group is selected in any one of the above manners as shown in FIGS. 2A to 2C.

Figure 3A:
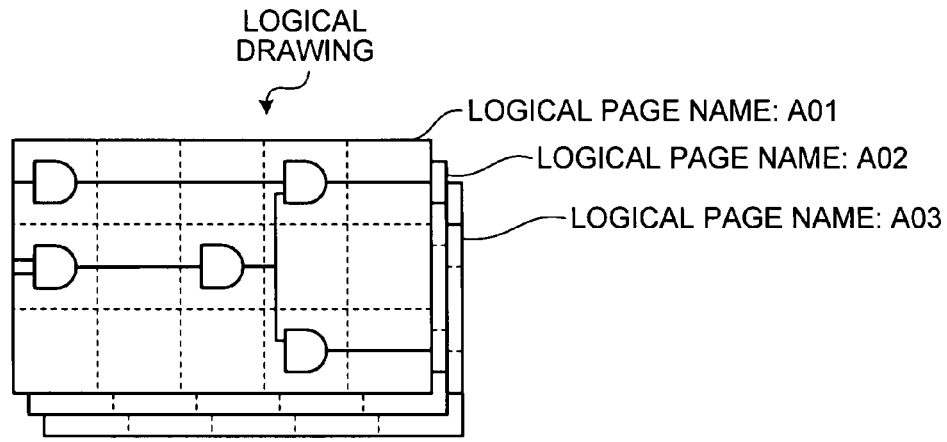
FIG. 3A is a diagram of a logical drawing having a plurality of logical pages.
Figure 3B:
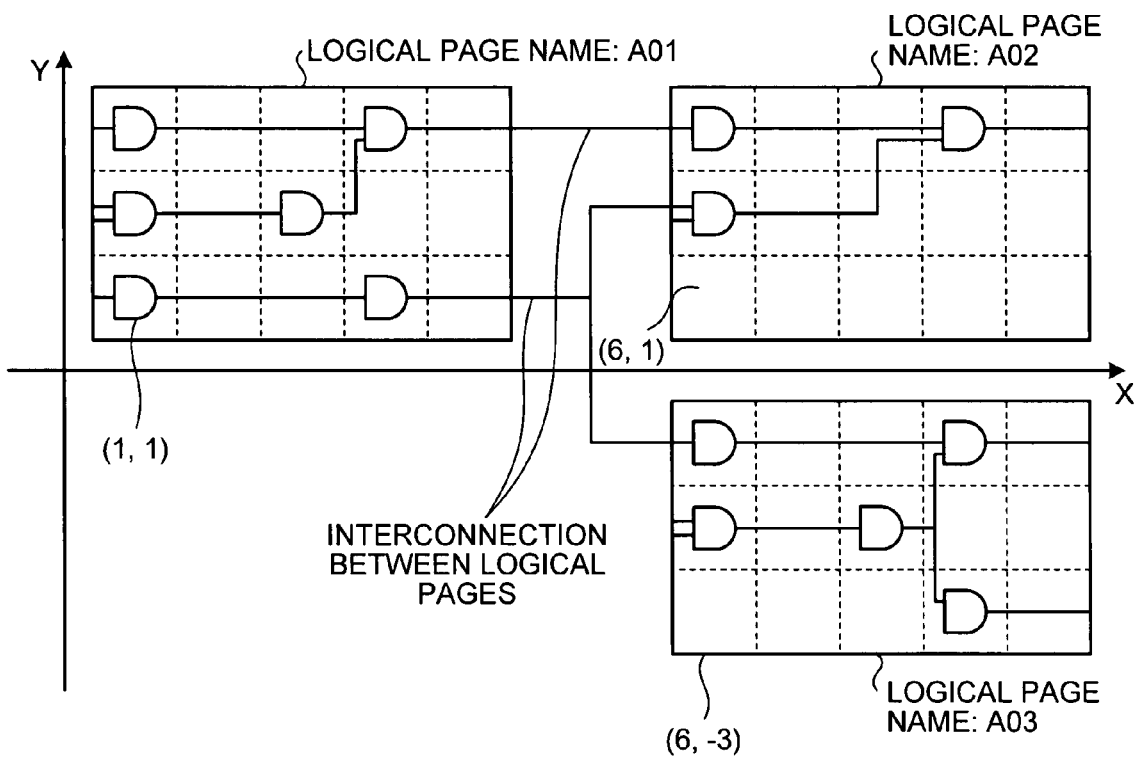
FIG. 3B is a diagram of an outline of how the logical pages are interconnected to each other.

FIG. 3A is a diagram of the logical drawing having a plurality of logical pages, and FIG. 3B is a diagram of the outline of how the logical pages are interconnected to each other. As shown in FIG. 3A, the logical drawing includes three logical pages such as a logical page name: A01, a logical page name: A02, and a logical page name: A03.

As shown in FIG. 3B, in an X-Y plane of an implementation drawing set on the logical drawing to identify a certain location on the logical drawing, it is possible to determine in which location each logical page is arranged, or to determine which cell of each logical page is interconnected to which cell of another logical page. A layout location of each logical page is expressed, as an example, by X-Y coordinates of each block located in the lower left-hand corner of each logical page, directed toward the X-Y plane of the implementation drawing. Referring to FIG. 3B, the logical page of the logical page name: A01 is arranged at (1, 1), the logical page of the logical page name: A02 is arranged at (6, 1), and the logical page of the logical page name: A03 is arranged at (6, −3). Each interconnect status of the cells in the logical pages is diagrammatically shown.

Figure 5A:
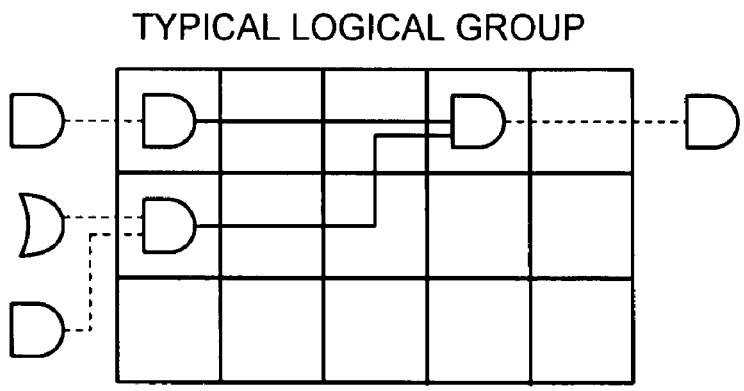
FIG. 5A is a diagram of a typical logical group.
Figure 5B:
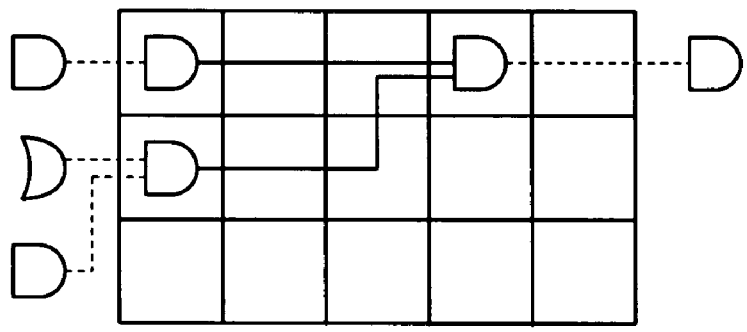
FIG. 5B is a diagram of an example of a logical group determined as a same logical group.

Each logical drawing has logical drawing information to identify an attribute of the respective logical drawings. FIG. 4 is a diagram for explaining information contained in logical drawing information of the logical drawing. The information contained therein includes "logical drawing name", "logical page name", "location information", "input/output (I/O) information", "instance information", "pin information", and "net information".

The "logical drawing name" is a name assigned to a logical drawing to identify the logical drawing. The "logical page name" indicates a stored list of names each to identify a lower logical page belonging to a higher logical drawing. The "location information" indicates X-Y coordinates of each logical page located on the X-Y plane of the implementation drawing. The "I/O information" is related to a connection relationship with another logical page including an input and an output of a corresponding logical page, and includes page information indicating a logical page to be connected, and location information indicating a layout location, on the X-Y plane of the implementation drawing, of a logical page identified by the page information.

The "instance information" uniquely manages individual cells, and includes page information to identify an instance, location information indicating a layout location of the individual cells on the X-Y plane, macro information indicating information for a macro contained in the instance, and pin information to identify the number of connecting pins or each location thereof in each cell.

The "pin information" is used to identify the number of pins or a location of each pin in a cell, of cells included in the logical page, being a connection interface with another logical page. The "pin information" includes a pin name which is a name of a pin, instance information to identify an instance of another connected logical page, and a connected net information indicating information for a connection relationship with a pin of another connected logical page. The "net information" indicates a connection relationship with another connected logical page.

For the information contained in the logical drawing information of the logical drawing, pieces of information such as the "location information", the "I/O information", the "instance information", the "pin information", and the "net information" are associated with each other for each logical page contained in each "logical drawing name". And the similar information is repeatedly stored for each logical group.

How to determine identity and similarity of each logical group selected by the IC design support program, the IC design support apparatus, and the IC design support method according to the embodiment is explained below with reference to FIGS. 5A to 5D. FIGS. 5A and 5B are diagrams of examples of a typical logical group and a logical group determined as a same logical group. As shown in FIG. 5A, the typical logical group of logical groups is specified. As shown in FIG. 5B, it is determined whether each logical group matches the typical logical group in a location, a connection relationship, a macro type, and a destination, to determine whether the logical group is classified as the same logical group. In the logical group determined as the one which exactly matches the typical logical group as shown in FIG. 5B, all the location, the connection relationship, the macro type, and the destination exactly match those of the typical logical group.

Figures 1, 5C:
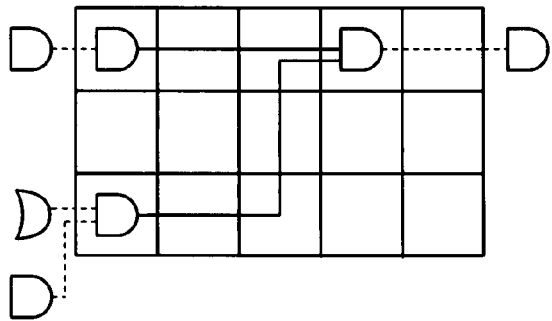
FIGS. 5C and 5D are diagrams of examples of a logical group determined as a similar logical group.
Figures 2, 5C:
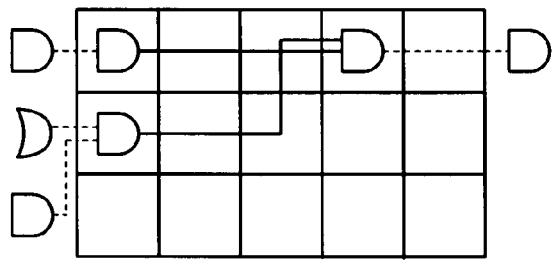
Figures 3, 5C:
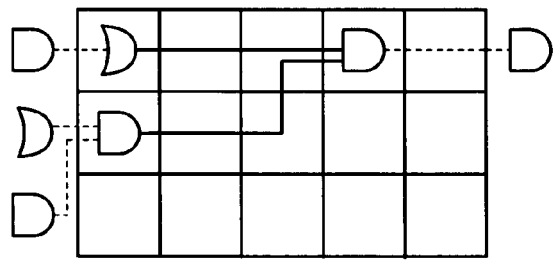
Figures 4, 5C:
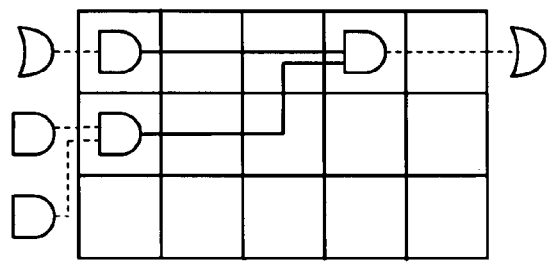
FIG. 4 is a diagram for explaining information contained in logical drawing information of the logical drawing.
Figures 1, 5D:
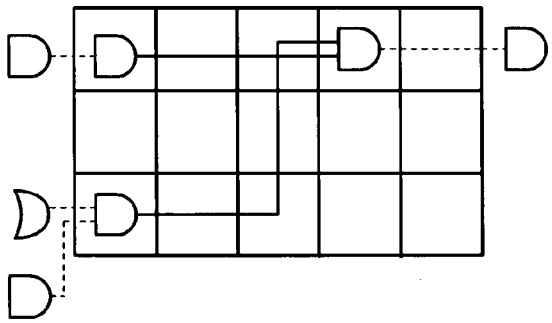
Figures 2, 5D:
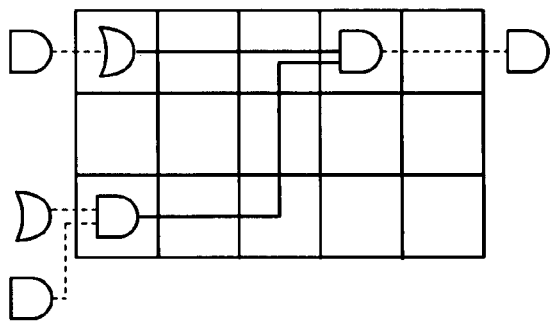
Figures 3, 5D:
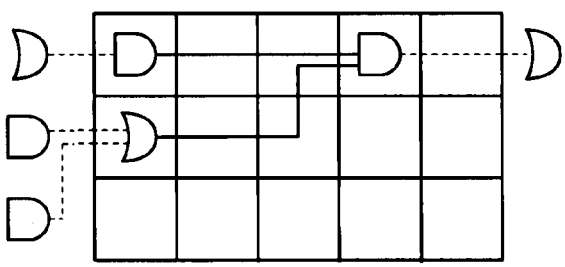

FIGS. 5C and 5D are diagrams of examples of a logical group determined as a similar logical group. It is determined whether part of the location, connection relationship, macro type, and destination in each logical group matches that of the typical logical group, to determine whether the logical group is classified as the similar logical group. The logical group determined as the similar logical group includes ones each of which includes a single mismatch as shown in FIG. 5C, and ones each of which includes multiple mismatches as shown in FIG. 5D.

The logical group determined as one that has a single mismatch with the typical logical group includes ones with a mismatch in only the location shown in FIG. 5C-1, a mismatch in only the connection relationship shown in FIG. 5C-2, a mismatch in only the macro type shown in FIG. 5C-3, and a mismatch in only the destination shown in FIG. 5C-4.

The logical group determined as one that has multiple mismatches with the typical logical group includes ones with mismatches in the location and the connection relationship shown in FIG. 5D-1, mismatches in the location and the macro type shown in FIG. 5D-2, and mismatches in the macro type and the destination shown in FIG. 5D-3. If any logical group satisfies any one of the conditions, the logical group is determined as a similar logical group which has the similarity to a typical logical drawing although it does not exactly match the typical logical drawing.

The logical groups, which have some differences only in part of the conditions from that of the typical logical group although they do not exactly match the typical logical drawing, are determined as the similar logical group and classified as the same group as the typical logical group in the above manner. This can organize variations of the logical groups, which enables to easily manage and handle the logical groups.

Information contained in the implementation pattern information is explained below with reference to FIG. 6. At least one type of implementation pattern is created according to one logical group allowing for wiring capability, efficiency of layout space of cells, and the whole shape of a pattern, from logical groups. The implementation pattern information indicates an attribute of the created implementation pattern. FIG. 6 is a diagram for explaining information contained in the implementation pattern information. The implementation pattern mentioned here indicates an instance which is an entity when a macro is arranged in the implementation drawing.

As shown in FIG. 6, the information contained in the implementation pattern information includes "logical group name", "implementation pattern name", and "layout location". The "logical group name" is a name of a logical group to identify a logical group as a base for creating an implementation pattern.

The "implementation pattern name" is a name assigned to an implementation pattern created based on the relevant logical group as a higher group. The "layout location" is a layout location of an instance, and information below the "layout location" includes "(instance) No.", "coordinates", "instance (cell) name", "destination instance No.", and "inter-cell distance".

The "(instance) No." is identification information to identify a relevant instance. The "coordinates" indicates coordinates on the X-Y plane of the implementation drawing where the instance is arranged. The "instance (cell) name" includes "page name" and "location name". The "page name" is a name assigned to an instance to identify the instance. The "location name" is information indicating a location where the instance is arranged, and, as an example, the "location name" may be the same as the "coordinates". The "instance (cell) name" is formed with a combination of the "page name" and the "location name", which is unique.

The "destination instance No." indicates "No." of a destination instance on a receiver side with respect to the instance set as a driver side. The "inter-cell distance" indicates each distance between central points of cells as instances each of which connection is identified by the "destination instance No.".

The information contained in the implementation pattern information is associated with each information of the "layout location" for each implementation pattern contained in each "logical group" in the above manner, and the similar information is repeatedly stored for each unit of logical group.

Figure 7A:
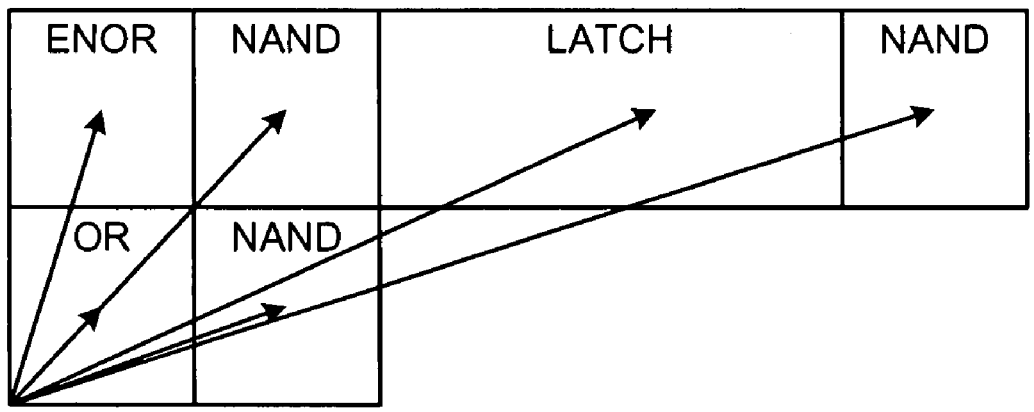
FIGS. 7A and 7B are diagrams for explaining information of instances (cells) forming a logical group.
Figure 7B:
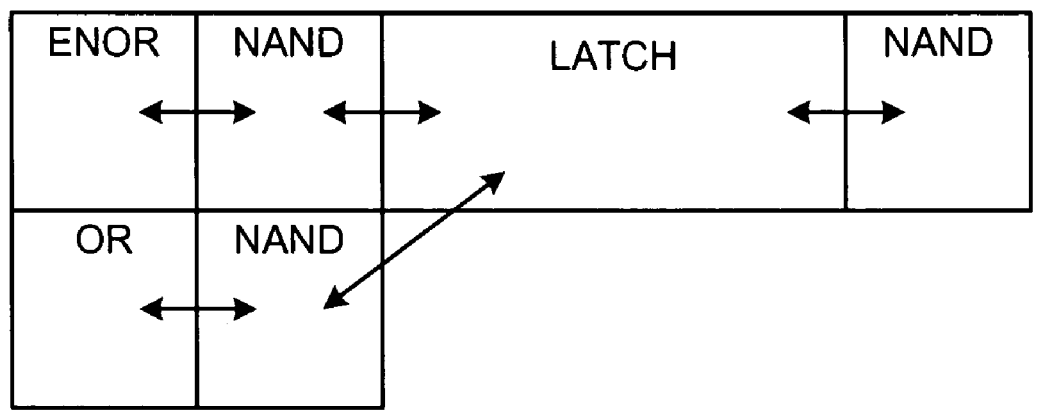

FIGS. 7A and 7B are diagrams for explaining information of instances (cells) forming a logical group. As shown in FIG. 7A, the layout location of each instance (cell) is indicated by coordinates from an origin in the X-Y plane of the implementation drawing. A specific example of this layout location is "coordinates" at the "layout location" of each instance, explained with reference to FIG. 6.

A specific example of distance information between instances (cells) in a logical group having a connection relationship as shown in FIG. 7B is "inter-cell distance" in the "layout location" of each instance, explained with reference to FIG. 6.

In the embodiment, the distance information in a connection relationship between cells as instances in the implementation pattern is determined as an inter-cell distance, but the distance information is not limited thereto. Therefore, the distance information may be determined as an inter-pin distance between pins of the cells. By thus setting, the distance information for the connection relationship can be determined as information corresponding to more real status such as a connection between pins, and this allows the distance information to be more accurate.

Figures 8A, 8B:
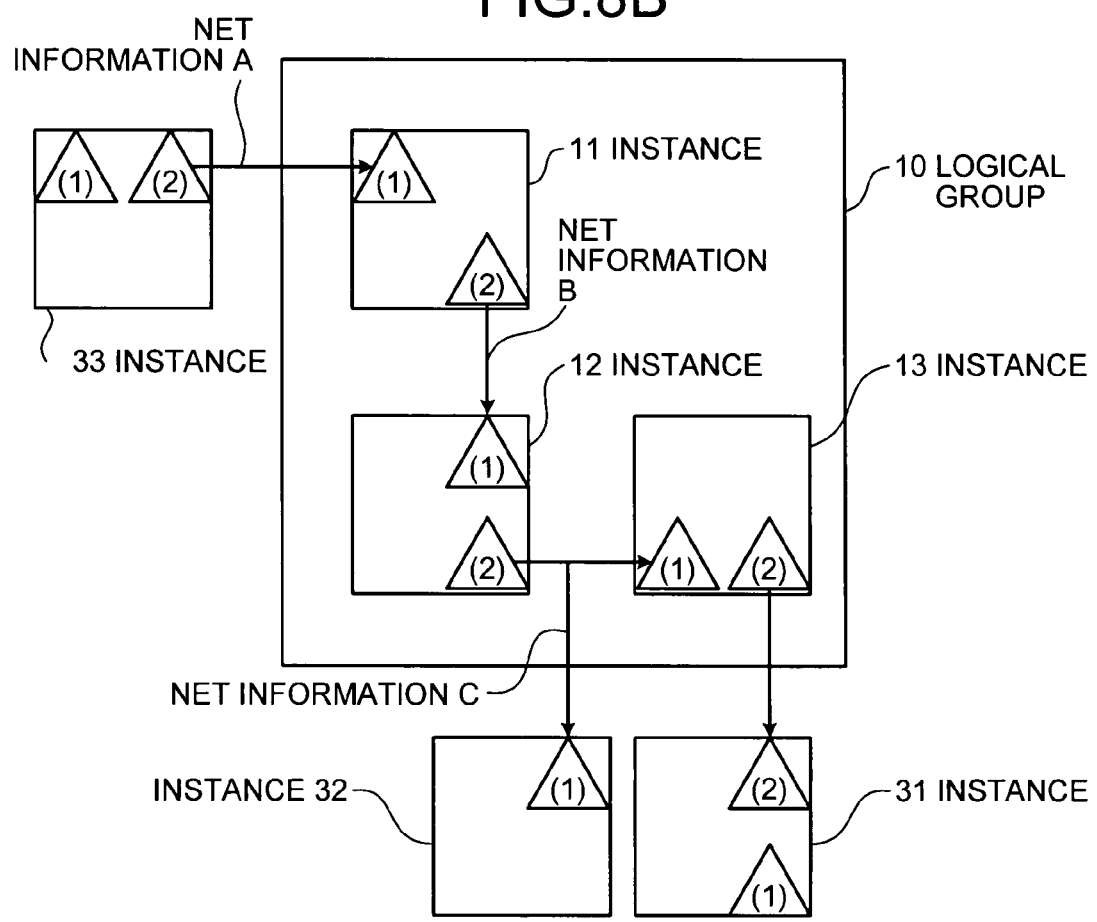
FIGS. 8A and 8B are diagrams for explaining information contained in logical group information.

FIGS. 8A and 8B are diagrams for explaining information contained in the logical group information. As shown in FIG. 8A, the logical group information includes "logical group name", "total number of cells", "intra-group instance information", "net information", and "hierarchical information".

As shown in FIG. 8B, an instance 33 which is an instance outside a logical group 10 has pins (1) and (2). The logical group 10 has instances 11, 12, and 13. The instances 11, 12, and 13 have connecting pins (1) and (2), respectively. An instance 31 which is an instance outside the logical group 10 has pins (1) and (2), and an instance 32 which is also an instance outside the logical group 10 has a pin (1). A table of FIG. 8A is referred to under the statuses of the logical group, the instances, and the pins.

The "logical group name" is a name assigned to a logical group to identify the logical group. The "total number of cells" is information indicating the number of total cells contained in the logical group. The "intra-group instance information" includes a list of instances contained in the logical group. The "net information" is identification information assigned to a connection relationship between pins in respective instances.

For example, referring to FIGS. 8A and 8B, "A" as the "net information" is associated with the "instance 11". This indicates "net information A" as a connection relationship directed from the pin (1) of the instance 33 to the pin (1) of the instance 11 in the logical group 10. "B" as the "net information" is associated with the "instance 12". This indicates "net information B" as a connection relationship directed from the pin (2) of the instance 11 to the pin (1) of the instance 12 within the logical group 10.

Furthermore, "C" as the "net information" is associated with the "instance 13". This indicates "net information C" as a connection relationship directed from the pin (2) of the instance 12 to the pin (1) of the instance 13 within the logical group 10. According to the "net information C", it is understood that there is a connection relationship from the pin (2) of the instance 12 to the pin (1) of the instance 32.

The "hierarchical information" includes a list of names of logical groups, such as logical groups 20 and 30, which belong to a lower layer of the logical group.

In this manner, the information contained in the logical group information is associated with each pieces of information such as the "total number of cells", the "intra-group instance information", the "net information", and the "hierarchical information" for each "logical group". The similar information is repeatedly stored for each logical group.

Figure 9A:
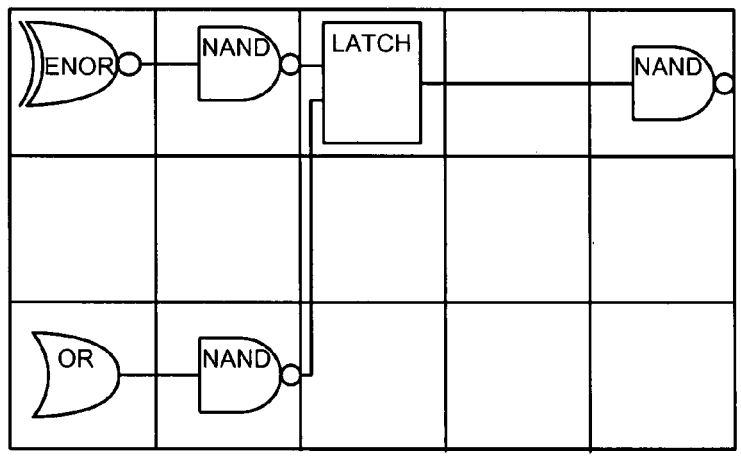
FIGS. 9A to 9C are diagrams of an outline of how to create an implementation pattern from a logical group.
Figure 9B:
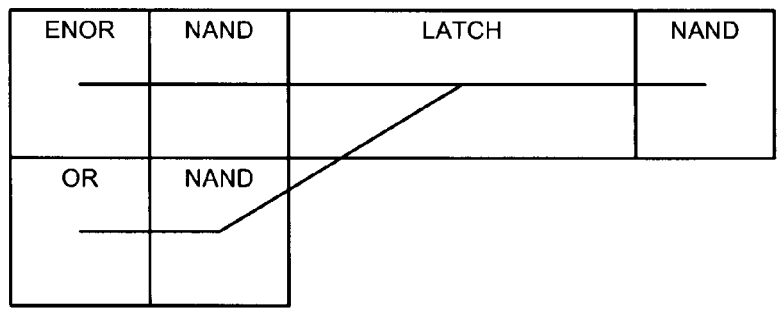
Figure 9C:
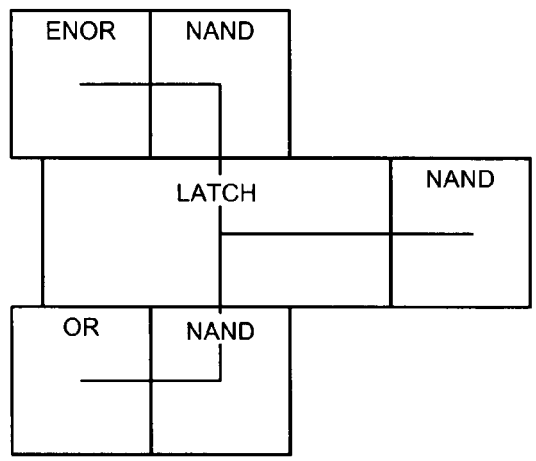

FIGS. 9A to 9C are diagrams of an outline of how to create an implementation pattern from a logical group. As shown in FIG. 9A, cells are arranged in a block with three rows and five columns. More specifically, as shown in FIG. 9A, a signal is input from "ENOR" to "NAND" and from the "NAND" to "Latch", and at the same time, a signal is input from "OR" to another "NAND" and from the "NAND" to the "Latch". And there is a further connection from the "Latch" to another further "NAND", and this enables a connection to an external logical group. "An implementation pattern created in association with display locations of cells in an logical group" as shown in FIG. 9B indicates a case where the cells are simply arranged by focusing on only a relationship in respective location between the cells in the logical group. "An implementation pattern created allowing for a layout space and wiring capability" as shown in FIG. 9C indicates a case where an implementation pattern is created by selecting an implementation pattern such that a layout space for all the cells is a minimum, from a method of arranging the cells in such a manner that each distance between cells is a predetermined value or less. Alternatively, as also shown in FIG. 9C, "the implementation pattern created allowing for a layout space and wiring capability" may be a case where the implementation pattern is created by selecting a method of arranging cells in such a manner that each distance between the cells is a minimum, from implementation patterns each in which the layout space for all the cells is a predetermined value or less.

Implementation patterns created corresponding to logical groups are visually displayed in the form of a list to select the implementation pattern in GUI of a display unit 110 which is connected to an IC design support apparatus 100, explained later, according to the embodiment. Alternatively, to select the implementation pattern, corresponding logical groups are visually displayed in the form of a list in the GUI of the display unit 110.

Figure 10:
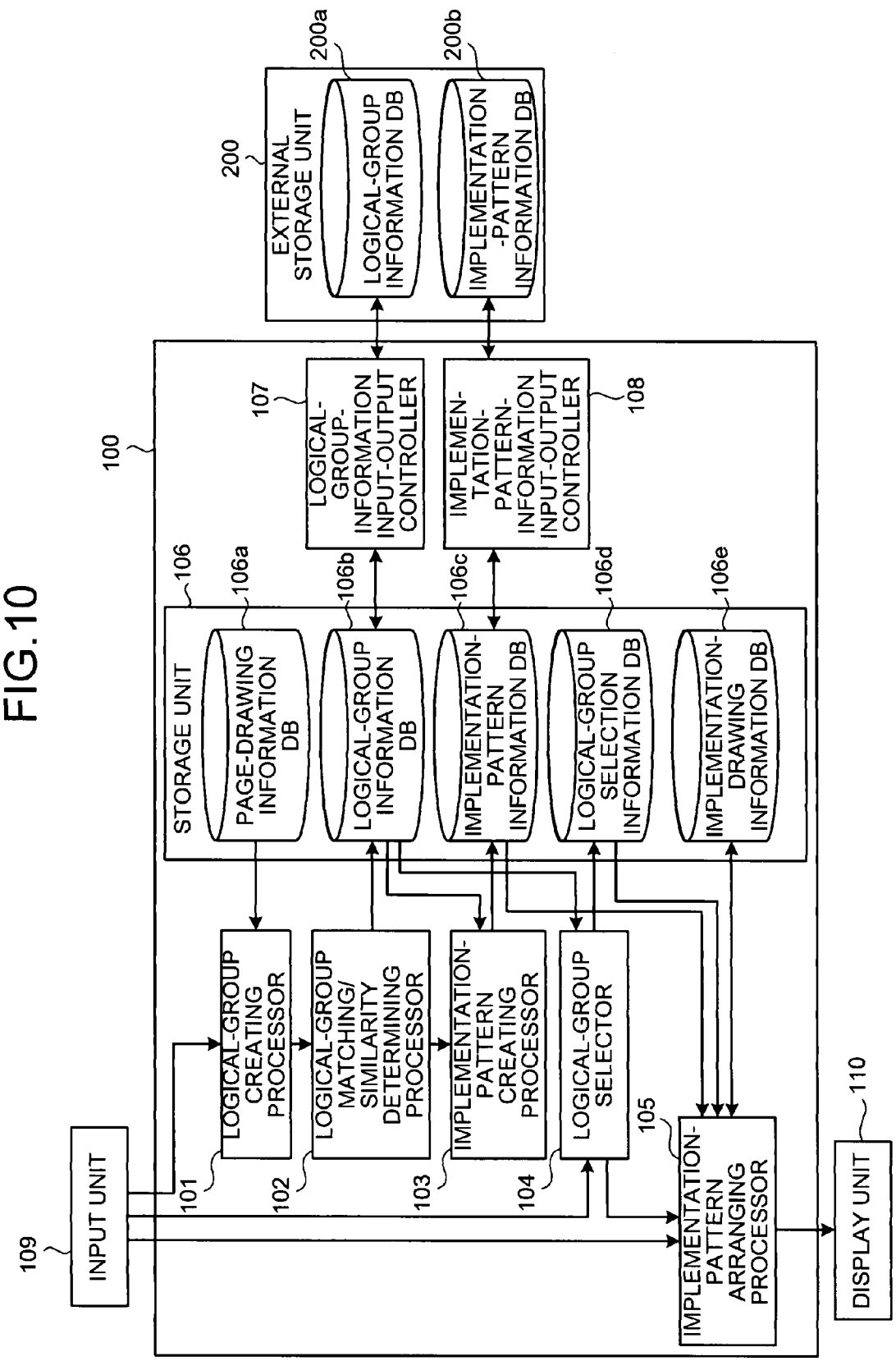
FIG. 10 is a functional block diagram of an IC design support apparatus.

FIG. 10 is a functional block diagram of the IC design support apparatus. The IC design support apparatus includes a logical-group creating processor 101, a logical-group matching/similarity determining processor 102, an implementation-pattern creating processor 103, a logical-group selector 104, an implementation-pattern arranging processor 105, a storage unit 106, a logical-group-information input-output controller 107, and an implementation-pattern-information input-output controller 108.

The IC design support apparatus is connected with an input unit 109 that accepts an input operation through a keyboard and a mouse, and with the display unit 110 such as a display device that displays thereon results of processes.

The storage unit 106 is a nonvolatile memory, and includes a page-drawing information Data Base (DB) 106a, a logical-group information DB 106b, an implementation-pattern information DB 106c, a logical-group selection information DB 106d, and an implementation-drawing information DB 106e.

The page-drawing information DB 106a previously stores therein page drawings of a logical drawing that is an input drawing to select a logical group used to create an implementation drawing of an IC. The stored page drawings are classified by each logical drawing.

The logical-group information DB 106b determines the matching and similarity of the logical groups selected from the page drawing to classify the logical groups, and stores therein the classified logical groups according to the classification,. The implementation-pattern information DB 106c stores therein implementation patterns created corresponding to respective logical groups based on the logical groups contained in the classified logical groups.

The logical-group selection information DB 106d stores therein information to specify a logical group selected to create an implementation drawing. That is, the logical-group selection information DB 106d stores therein information as to which of logical groups is selected to create the implementation drawing. The logical-group selection information DB 106d stores therein information as to which logical groups are selected and how the logical groups are mutually arranged and connected.

The implementation-drawing information DB 106e stores therein information for an implementation drawing created by selecting logical groups, arranging corresponding implementation patterns, and mutually connecting the implementation patterns to each other. Namely, the implementation-drawing information DB 106e stores therein information for the implementation drawing describing the arrangement and connection of the implementation patterns.

The logical-group creating processor 101 is a processor that reads an input drawing from the page-drawing information DB 106a according to the operation through the input unit 109, and determines a selection range of cells to create logical groups. When the logical groups are created, the logical-group matching/similarity determining processor 102 determines whether there is a match or similarity between the created logical groups, and classifies the logical groups into logical groups according to the matching or the similarity, assigns names thereto, to store the logical groups in the logical-group information DB 106b.

It is noted that definition (location, connection relationship, macro type, and destination) of the logical groups determined as similar ones by the logical-group matching/similarity determining processor 102 can be specified from an external device such as the input unit 109.

When the matching and the similarity of the logical groups are determined, the implementation-pattern creating processor 103 reads logical groups from the logical-group-information DB 106b, and creates corresponding implementation patterns. The created implementation patterns are stored in the implementation-pattern information DB 106c.

The logical-group selector 104 selects logical groups to create an implementation drawing, from the logical-group-information DB 106b according to the operation through the input unit 109. The logical-group selector 104 informs the implementation-pattern arranging processor 105 of the fact that the logical groups are selected, together with information to specify the selected logical groups. The logical-group selector 104 also stores the information to specify the selected logical groups, layout information for the selected logical groups, and information for connection between the selected logical groups, in the logical-group selection information DB 106d.

The implementation-pattern arranging processor 105 reads information for logical groups selected from the logical-group selection information DB 106d according to the operation through the input unit 109, reads implementation patterns corresponding to the logical groups to be arranged in an implementation drawing, and mutually connects the implementation patterns to each other. The implementation-pattern arranging processor 105 stores the implementation patterns arranged in the implementation drawing and mutually connected to each other, together with their layout information and connection information in the implementation-drawing information DB 106e. The implementation-pattern arranging processor 105 displays the implementation drawing in which the implementation patterns are arranged and mutually connected to each other, on the display unit 110.

The operation through the input unit 109 includes those for selecting and determining a layout location of a new implementation pattern by mouse clicking, and for selecting and determining a layout location/shift location of the already-arranged implementation pattern by mouse dragging.

The implementation-pattern arranging processor 105 acquires information for the already-arranged implementation pattern as arrangement blockage information, from an implementation drawing to be processed which is stored in the implementation-drawing information DB 106e. This acquisition enables arrangement of an implementation pattern by avoiding the already-arranged implementation pattern upon additional arrangement of an implementation pattern in the implementation drawing to be processed.

Therefore, the implementation-pattern arranging processor 105 can perform a modification process of the implementation pattern so that the implementation pattern can be arranged so as to avoid the blockage based on the arrangement blockage information around the layout location of the implementation pattern specified on the implementation drawing by the operation through the input unit 109.

An external storage unit 200 is an independent storage device connected to an external device of the IC design support apparatus. The external storage unit 200 is a magnetic disk drive, a magneto-optical disk drive, a portable magnetic-disk read/write device, a portable magneto-optical-disk read/write device, or a magnetic tape device. The external storage unit 200 includes a logical-group information DB 200a and an implementation-pattern information DB 200b.

The logical-group information DB 200a includes stored contents of at least the logical-group information DB 106b. The stored contents of the logical-group information DB 200a can be copied to the logical-group information DB 106b. The logical-group information DB 106b and the logical-group information DB 200a are connected to each other through the logical-group-information input-output controller 107, to enable mutual exchange of respective information.

The implementation-pattern information DB 200b includes stored contents of at least the implementation-pattern information DB 106c. The stored contents of the implementation-pattern information DB 200b can be copied to the implementation-pattern information DB 106c. The implementation-pattern information DB 106c and the implementation-pattern information DB 200b are connected to each other through the implementation-pattern-information input-output controller 108, to enable mutual exchange of respective information.

In this manner, the logical-group information DB 200a and the implementation-pattern information DB 200b are provided in an external storage, to enable sharing of the logical group information and the implementation pattern information with an external IC design support apparatus. Thus, the reusability of the logical group information and of the implementation pattern information is enhanced, and it is thereby possible to use both of them for another design and to improve the utility value and the usability of the IC design support apparatus.

Figure 11:
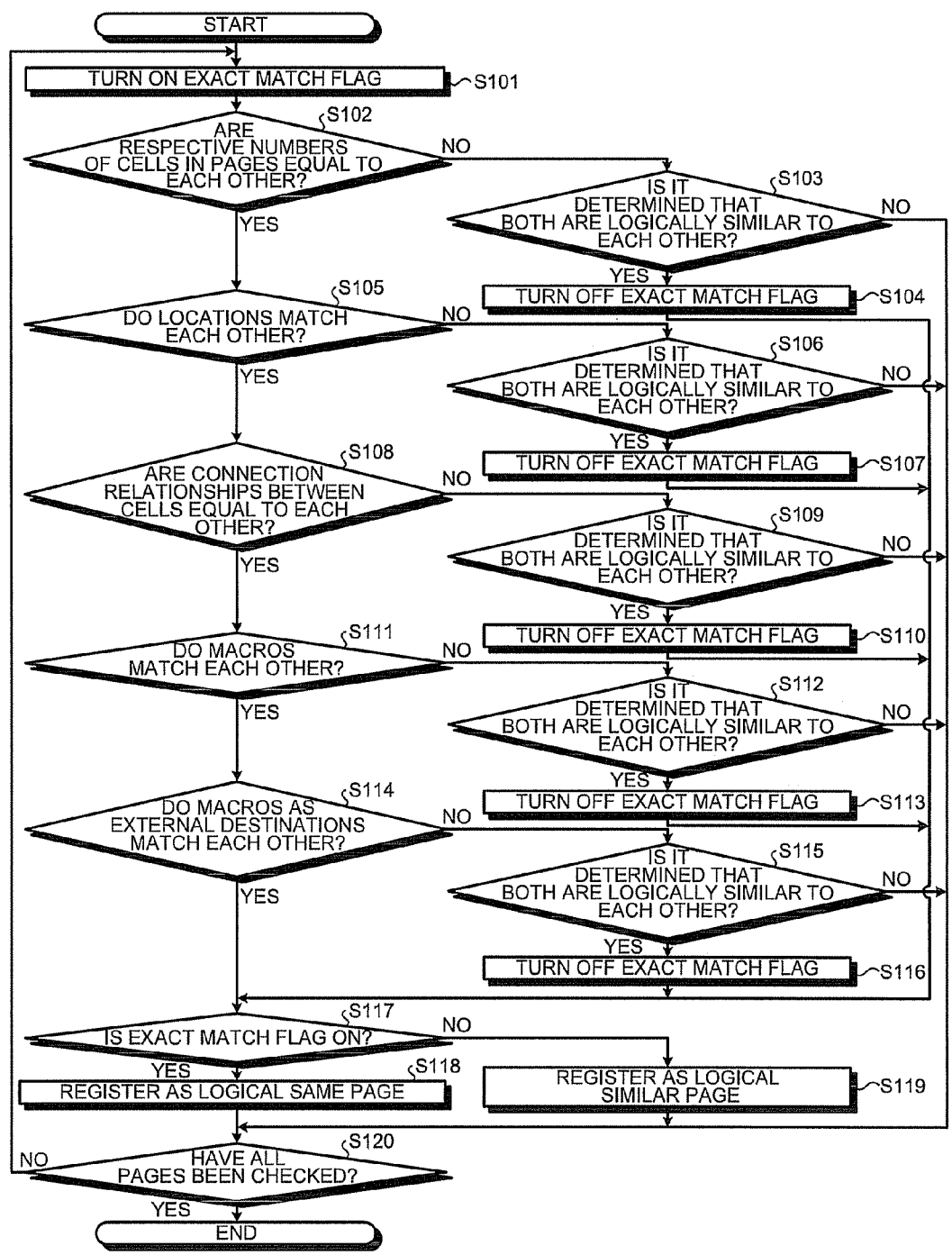
FIG. 11 is a flowchart of a procedure of a logical-group matching/similarity determining process.

FIG. 11 is a flowchart of a procedure of a logical-group matching/similarity determining process executed in the IC design support apparatus shown in FIG. 10. An "exact match flag" stored in a temporary storage unit (not shown) is turned on first (step S101). Then, it is determined whether the respective numbers of cells in selected logical pages are equal to each other (step S102). When it is determined that both are equal to each other (YES at step S102), the process proceeds to step S105, while when it is determined that both are not equal to each other (NO at step S102), the process proceeds to step S103.

At step S103, it is determined whether the numbers of cells are logically similar to each other according to preset contents. When it is determined that both are logically similar to each other (YES at step S103), the exact match flag is tuned off (step S104), and the process proceeds to step S117.

At step S105, it is determined whether locations of the cells in the selected logical pages match each other. When it is determined that both match each other (YES at step S105), the process proceeds to step S108, while when it is determined that both do not match each other (NO at step S105), the process proceeds to step S106.

At step S106, it is determined whether the locations are logically similar to each other according to the preset contents. When it is determined that both are logically similar to each other (YES at step S106), the exact match flag is tuned off (step S107), and the process proceeds to step S117.

At step S108, it is determined whether connection relationships between the cells in the selected logical pages are equal to each other. When it is determined that both are equal to each other (YES at step S108), the process proceeds to step S111, while when it is determined that both are not equal to each other (NO at step S108), the process proceeds to step S109.

At step S109, it is determined whether the connection relationships are logically similar to each other according to the preset contents. When it is determined that both are logically similar to each other (YES at step S109), the exact match flag is tuned off (step S110), and the process proceeds to step S117.

At step S111, it is determined whether macros of the selected logical pages match each other. When it is determined that both match each other (YES at step S111), the process proceeds to step S114, while when it is determined that both do not match each other (NO at step S111), the process proceeds to step S112.

At step S112, it is determined whether the macros are logically similar to each other according to the preset contents. When it is determined that both are logically similar to each other (YES at step S112), the exact match flag is tuned off (step S113), and the process proceeds to step S117.

At step S114, it is determined whether external destination macros of the selected logical pages match each other. When it is determined that both match each other (YES at step S114), the process proceeds to step S117, while when it is determined that both do not match each other (NO at step S114), the process proceeds to step S115.

At step S115, it is determined whether the external destination macros are logically similar to each other according to the preset contents. When it is determined that both are logically similar to each other (YES at step S115), the exact match flag is tuned off (step S116), and the process proceeds to step S117.

At step S117, it is determined whether the exact match flag is on. When it is determined that it is on (YES at step S117), the two compared logical groups are registered as the same logical pages in the logical-group information DB 106b (step S118). On the other hand, when it is determined that the exact match flag is not on (NO at step S117), the two compared logical groups are registered as the similar logical pages in the logical-group information DB 106b (step S119).

When the process at step S118 or step S119 is ended, it is determined whether all the logical pages have been checked (step S120). When it is determined that all the logical pages have been checked (YES at step S120) the logical-group matching/similarity determining process is ended. When it is determined that not all the logical pages have been checked (NO at step S120), the process returns to step S101.

Figure 12:
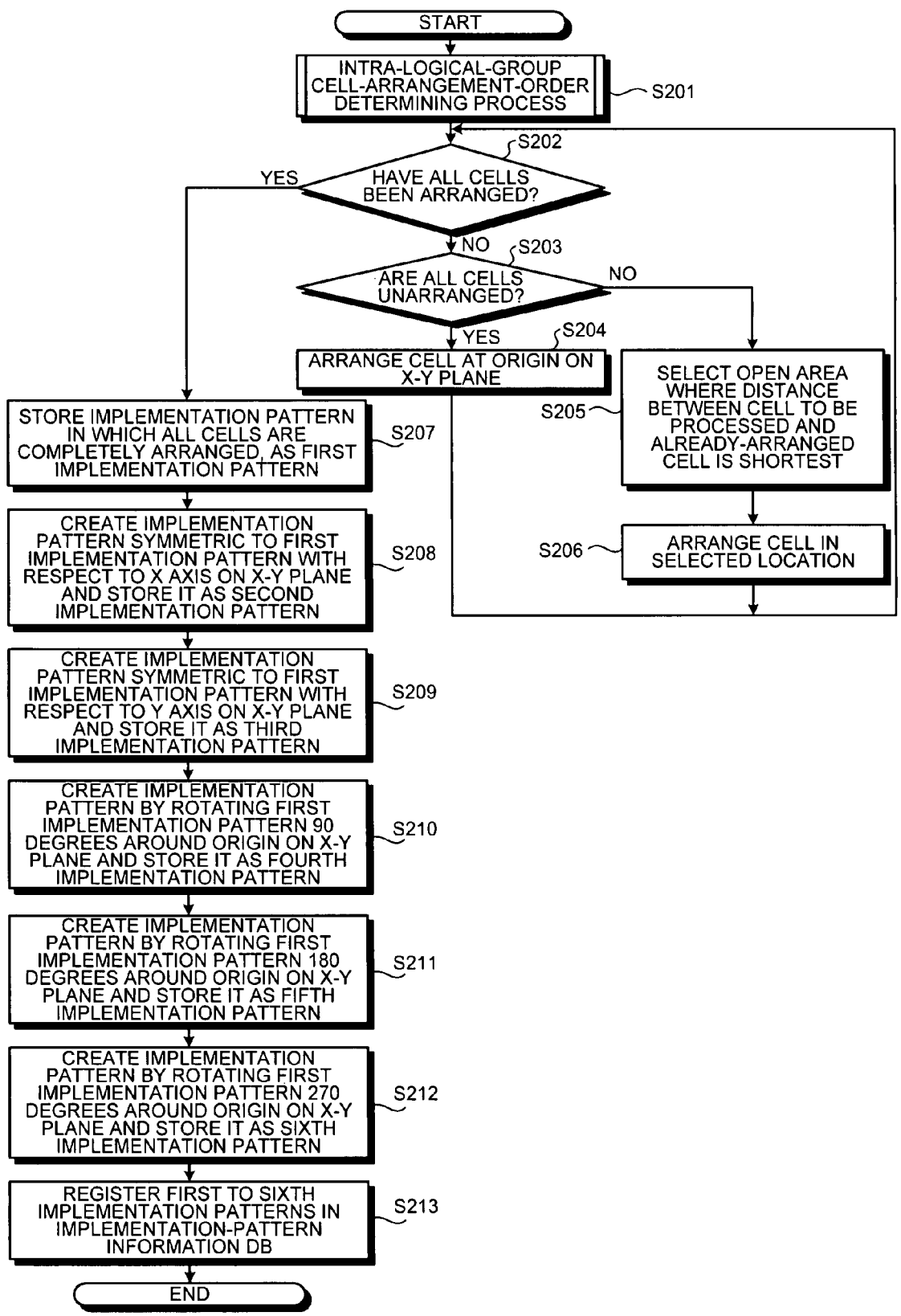
FIG. 12 is a flowchart of a procedure of an implementation-pattern creating process.

FIG. 12 is a flowchart of a procedure of an implementation-pattern creating process executed in the IC design support apparatus shown in FIG. 10. The implementation-pattern creating process is automatically executed after the matching/similarity of the logical groups is determined, but it may be manually executed in response to execution of a predetermined operation. By enabling manual creation of an implementation pattern, it is possible to flexibly customize the implementation pattern.

As shown in FIG. 12, an intra-logical-group cell-arrangement-order determining process is executed first (step S201). Details of the intra-logical-group cell-arrangement-order determining process are explained later with reference to FIG. 13. Then, it is determined whether all the cells have been arranged (step S202). When it is determined that all the cell have been arranged (YES at step S202), the process proceeds to step S207. When it is determined that all the cell have not been arranged (NO at step S202), the process proceeds to step S203.

At step S203, it is determined whether all the cells are unarranged or all the cells are in an initial cell arrangement. When it is determined that all the cells are unarranged (YES at step S203), the cells are arranged at the origin on the X-Y plane of an implementation-pattern creation drawing (step S204), and the process proceeds to step S202. On the other hand, at step S205, an open area of a block on the implementation-pattern creation drawing, in which a distance between a cell to be processed and an already-arranged cell is a shortest, is selected, and the cell is arranged in a location of the selected area (step S206), and the process proceeds to step S202.

The implementation-pattern creation drawing mentioned here indicates a plane where grids (blocks) are arranged in a matrix to arrange cells and create an implementation pattern of a logical pattern. Similarly to the implementation drawing, each location of individual blocks can be identified by coordinates on the X-Y plane.

On the other hand, at step S207, an implementation pattern, in which all the cells are completely arranged, is stored as a first implementation pattern in a temporary storage unit (not shown). Consequently, an implementation pattern symmetric to the first implementation pattern with respect to the X axis is created on the X-Y plane of the implementation-pattern creation drawing, to be stored as a second implementation pattern in the temporary storage unit (step S208). Then, an implementation pattern symmetric to the first implementation pattern with respect to the Y axis is created thereon, to be stored as a third implementation pattern therein (step S209).

An implementation pattern is created by rotating the first implementation pattern 90 degrees around the origin on the X-Y plane of the implementation-pattern creation drawing, and the created implementation pattern is stored as a fourth implementation pattern in the temporary storage unit (step S210). Consequently, an implementation pattern is created by rotating the first implementation pattern by 180 degrees around the origin on the X-Y plane thereof, and the created implementation pattern is stored as a fifth implementation pattern therein (step S211). An implementation pattern is further created by rotating the first implementation pattern by 270 degrees around the origin on the X-Y plane thereof, and the created implementation pattern is stored as a sixth implementation pattern therein (step S212). The first to the sixth implementation patterns are stored in the implementation-pattern information DB 106c (step S213).

In the implementation-pattern creating process, cells are arranged so that a distance between cells is the shortest (step S205). At step S205, however, cells may be arranged so that not the distance between cells but a distance between connecting pins of the respective cells is the shortest.

A pattern of a relationship in relative location between cells similar to that of the first implementation pattern is created for the whole implementation pattern as a unit (steps S208 to S212). In other words, a symmetric implementation pattern is created based on symmetric property by using the whole first implementation pattern as a unit, and an implementation pattern is created by rotating the whole first implementation pattern as a unit. However, the creation is not limited thereto. Therefore, an implementation pattern may be created by reversing the first implementation pattern by units of cells or may be created by rotating it by units of cells. When the implementation pattern is created in the above manner, a relationship in respective location between pins of respective cells may be made different, and this enables creation of an implementation pattern which has a more efficient relationship in respective location between the pins.

Figure 13:
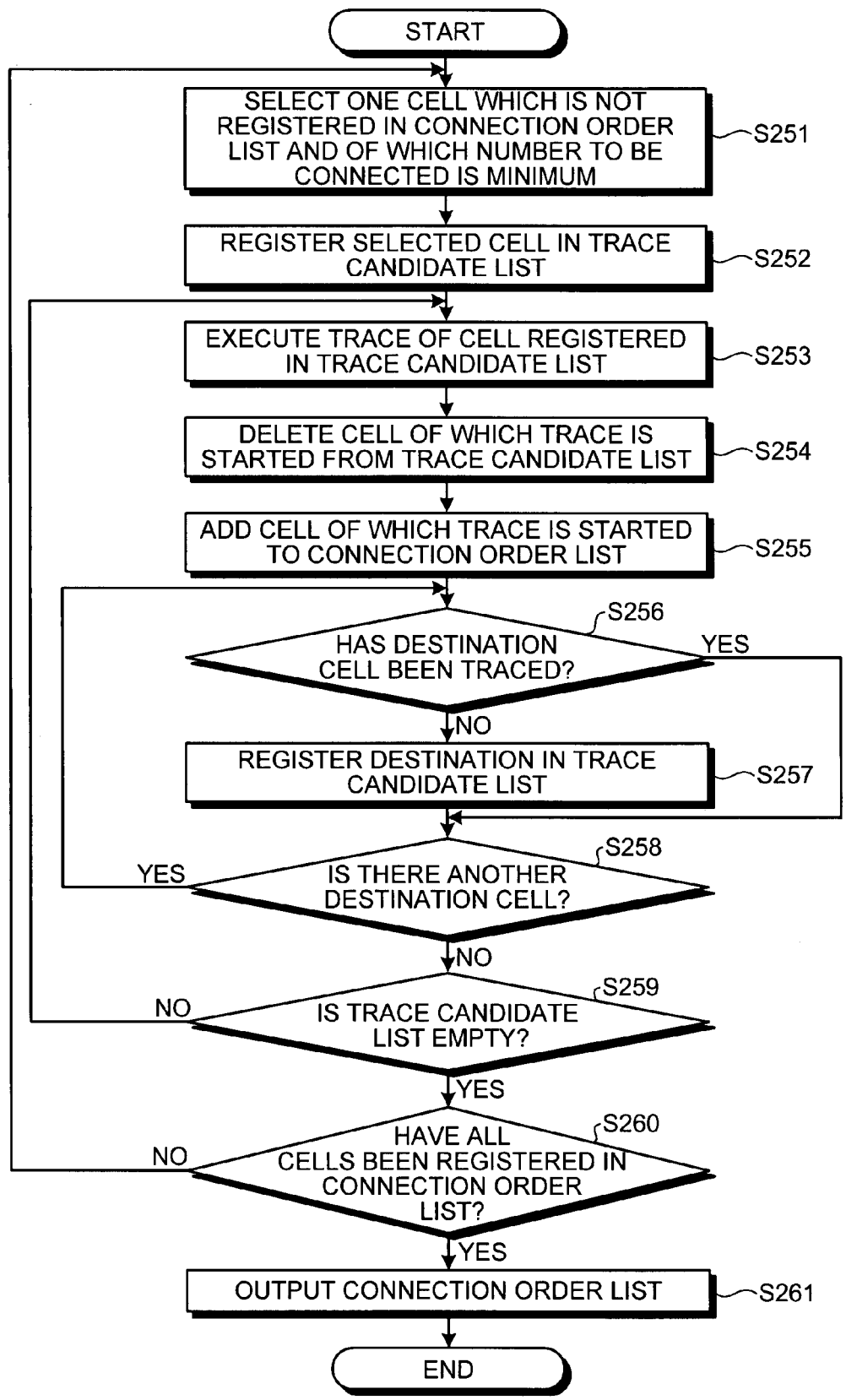
FIG. 13 is a flowchart of a procedure of an intra-logical-group cell-arrangement-order determining process.

FIG. 13 is a flowchart of a procedure of the intra-logical-group cell-arrangement-order determining process shown in FIG. 12. A cell having the minimum number of connected pins and not-yet-registered in a connection order list stored in the temporary storage unit (not shown) is first selected (step S251). Then, the selected cell is registered in a trace candidate list stored in the temporary storage unit (not shown) (step S252).

The cell registered in the trace candidate list is traced (step S253). The cell of which trace is started is deleted from the trace candidate list (step S254). The cell of which trace is started is added to the connection order list (step S255).

It is determined whether a destination cell has been traced (step S256). When it is determined that it has been traced (YES at step S256), the process proceeds to step S258, while when it is determined that it has not been traced (NO at step S256), the destination cell is added to the trace candidate list (step S257).

It is determined whether there is another destination cell (step S258). When it is determined that there is a destination cell (YES at step S258), the process proceeds to step S256, while when it is determined that there is no destination cell (NO at step S258), the process proceeds to step S259.

At step S259, it is determined whether the trace candidate list is empty, which means there is no registered candidate. When it is determined that the trace candidate list is empty (YES at step S259), the process proceeds to step S260, while when it is determined that the trace candidate list is not empty (NO at step S259), the process proceeds to step S253.

At step S260, it is determined whether all the cells have been registered in the connection order list (step S260). When it is determined that all the cells have been registered (YES at step S260), the connection order list is output (step S261), while when it is determined that all the cells have not been registered (NO at step S260), the process proceeds to step S251.

Figure 14:
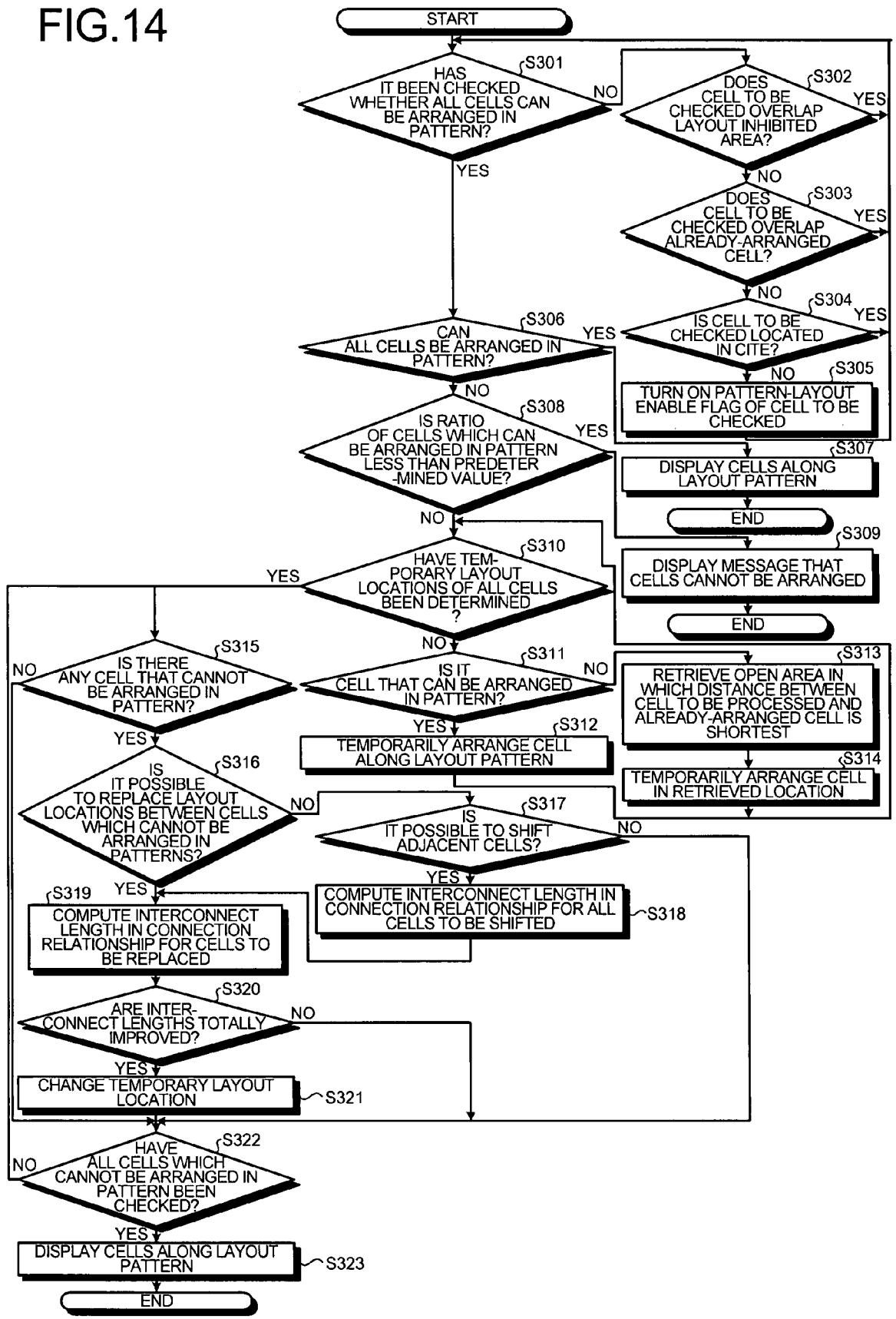
FIG. 14 is a flowchart of a procedure of an implementation-pattern arranging process.

FIG. 14 is a flowchart of a procedure of an implementation-pattern arranging process that is a process of arranging an implementation pattern in the implementation drawing in the IC design support apparatus shown in FIG. 10. The process indicates a process from temporary determination to final determination of a layout location by the mouse in the implementation drawing when the implementation pattern is selected to be arranged on the X-Y plane of the implementation drawing.

It is determined whether it has been checked whether all the cells can be arranged in a pattern (step S301). When it is determined that it has been checked (YES at step S301), the process proceeds to step S306, while when it is determined that it has not been checked (NO at step S301), the process proceeds to step S302.

At step S302, it is determined whether the cell to be checked overlaps a layout inhibited area. When it is determined that the cell overlaps the area (YES at step S302), the process proceeds to step S301, while when it is determined that the cell does not overlap the area (NO at step S302), the process proceeds to step S303.

At step S303, it is determined whether the cell to be checked overlaps an already-arranged cell. When it is determined that the cell to be checked overlaps the already-arranged cell (YES at step S303), the process proceeds to step S301, while when it is determined that the cell to be checked does not overlap the already-arranged cell (NO at step S303), the process proceeds to step S304.

At step S304, it is determined whether the cell to be checked is located in a cite (X-Y plane of the implementation drawing). When it is determined that the cell is located therein (YES at step S304), a pattern-layout enable flag of the cell to be checked is turned on (step S305), and the process proceeds to step S301. When it is determined that the cell is not located therein (NO at step S304), the process proceeds to step S301.

At step S306, it is determined whether all the cells can be arranged in the pattern, i.e., all the cells can be arranged in respective temporary layout locations. When it is determined that all the cells can be arranged in the pattern (YES at step S306), the cells are displayed according to the layout pattern (step S307). When it is determined that all the cells can not be arranged in the pattern (NO at step S306), the process proceeds to step S308.

At step S308, it is determined whether a ratio of cells which can be arranged in the pattern is less than a predetermined value (e.g., 30%). When it is determined that the ratio of the cells is less than the predetermined value (YES at step S308), the process proceeds to step S310. When it is determined that the ratio of the cells is not less than the predetermined value (NO at step S308), it is displayed that the cells cannot to be displayed according to the layout pattern (step S309).

At step S310, it is determined whether the temporary layout locations for all the cells have been determined (step S310). When it is determined that the temporary layout locations have been determined (YES at step S310), the process proceeds to step S315, while when it is determined that the temporary layout locations have not been determined (NO at step S310), the process proceeds to step S311.

At step S311, it is determined whether one of sequentially selected cells is specified as a cell to be processed, and it is determined whether the cell can be arranged in the pattern. When it is determined that the cell can be arranged in the pattern (YES at step S311), the process proceeds to step S312, while when it is determined that the cell cannot be arranged in the pattern (NO at step S311), the process proceeds to step S313.

At step S312, the cell is temporarily arranged according to the layout pattern. On the other hand, at step S313, an open area on the X-Y plane of the implementation drawing is retrieved. Specifically, the open area is a shortest distance between the cell to be processed and the already-arranged cell. The cell to be processed is temporarily arranged in the retrieved location (step S314). The process at step S312 or step S314 is ended, and the process proceeds to step S310.

At step S315, it is determined whether there is any cell which cannot be arranged in the pattern. When it is determined that there is the cell (YES at step S315), the process proceeds to step S316, while when it is determined that there is no such a cell (NO at step S315), the process proceeds to step S322.

At step S316, it is determined whether layout locations of cells which cannot be arranged in respective patterns can be replaced with each other. When it is determined that the replacement is possible (YES at step S316), the process proceeds to step S319.

At step S317, it is determined whether shift movement (movement in the X direction or in the Y direction) of adjacent cells (cells locating around the cells) is possible. When it is determined that the shift movement is possible (YES at step S317), each interconnect length (inter-cell distance) in a connection relationship for all the cells to be shifted is computed (step S318), and the process proceeds to step S319.

At step S319, each interconnect length (inter-cell distance) in a connection relationship for cells to be replaced with each other is computed, and the process proceeds to step S320. At step S320, it is determined whether interconnect lengths are totally improved. When it is determined that the interconnect lengths are improved (YES at step S320), the temporary layout locations are changed (step S321), and the process proceeds to step S322, while when it is determined that they are not improved (NO at step S320), the process proceeds to step S322.

At step S322, it is determined whether all the cells which cannot be arranged in the pattern have been checked. When it is determined that all the cells have been checked (YES at step S322), the cells are displayed according to the layout pattern (step S323). When it is determined that all the cells have not been checked (NO at step S322), the process proceeds to step S315.

Figures 1, 15A:
Figures 2, 15A:
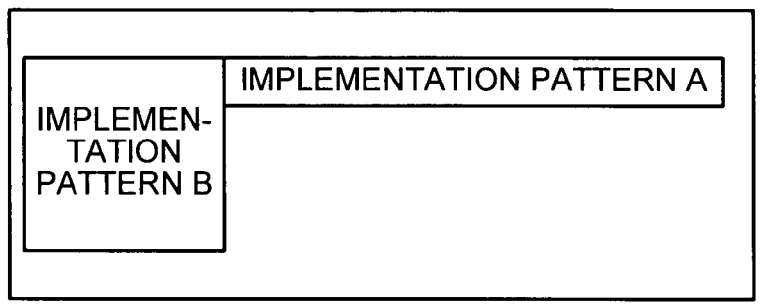
Figures 3, 15A:
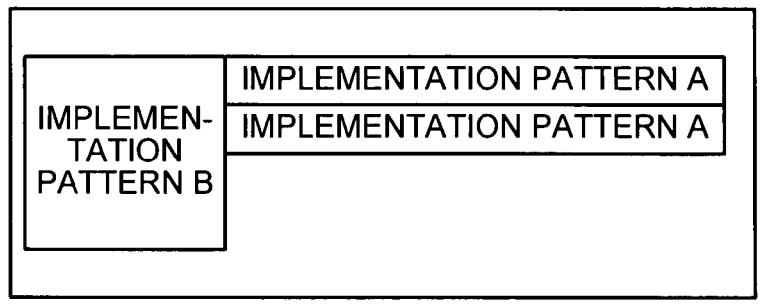
Figures 4, 15A:
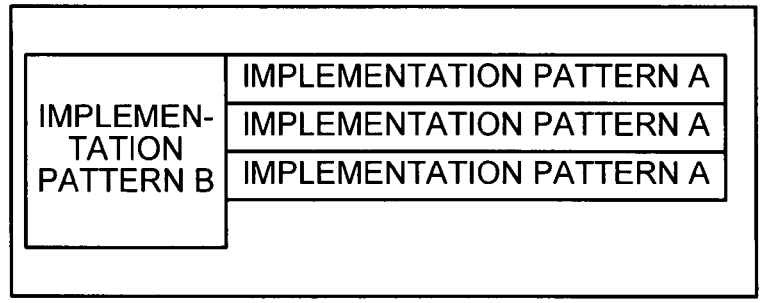

FIGS. 15A-1 to 15A-4 are diagrams for explaining an outline of how to arrange implementation patterns corresponding to the first feature of the present invention shown in FIG. 1. More specifically, these figures indicate the outline of how implementation patterns formed with a plurality of macros which are previously created are sequentially arranged. Similarly to FIG. 1A-1, the implementation pattern A includes Latches arranged in two rows and four columns, and the implementation pattern B includes Latches arranged in eight rows and one column.

As shown in FIG. 15A-1, one logical group is selected from the match/similar logical groups visually displayed in the form of a list in GUI of the display unit 110 in the IC design support apparatus, and one implementation pattern B corresponding to the selected logical group is arranged. As shown in FIG. 15A-2, an implementation pattern A as a second implementation pattern is arranged so as not to overlap the area of the already-arranged implementation pattern B. As shown in FIG. 15A-3, an implementation pattern A as a third implementation pattern is arranged so as not to overlap the areas of the already-arranged implementation pattern B and implementation pattern A. As shown in FIG. 15A-4, an implementation pattern A as a fourth implementation pattern is arranged so as not to overlap the areas of the already-arranged implementation pattern B and implementation patterns A.

In this manner, the implementation pattern corresponding to the selected logical group is arranged within a range not overlapped with the area of the already-arranged implementation pattern, according to the displayed location in the implementation drawing without deforming the previously created shape. This enables to select logical patterns or implementation patterns corresponding to the logical patterns while viewing a layout and connection relationship of cells, thus, preventing erroneous selection and efficiently creating an implementation drawing.

Figures 1, 15B:
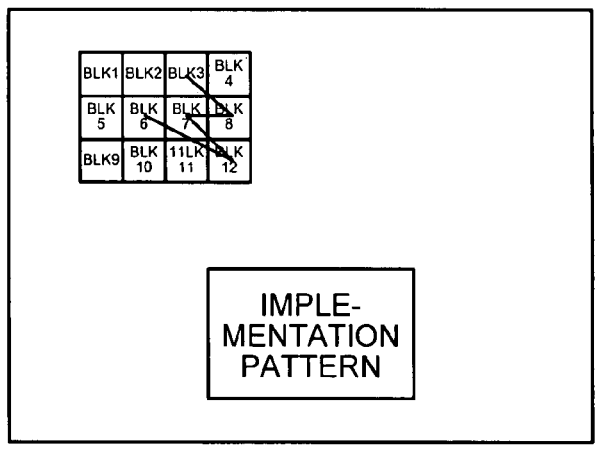
Figures 2, 15B:
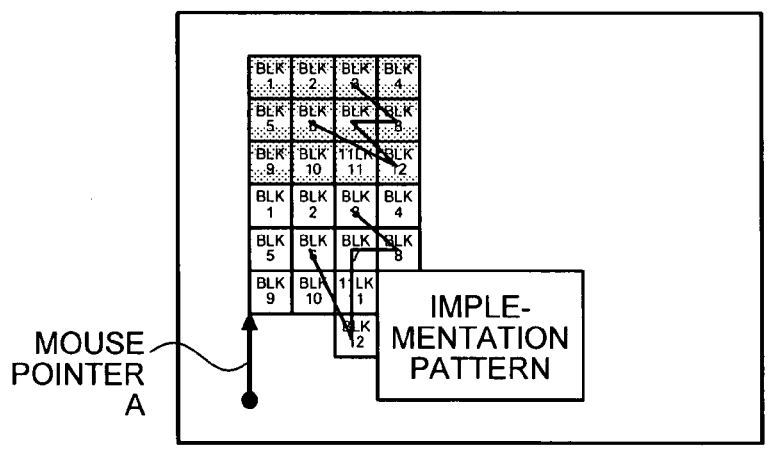
Figures 3, 15B:
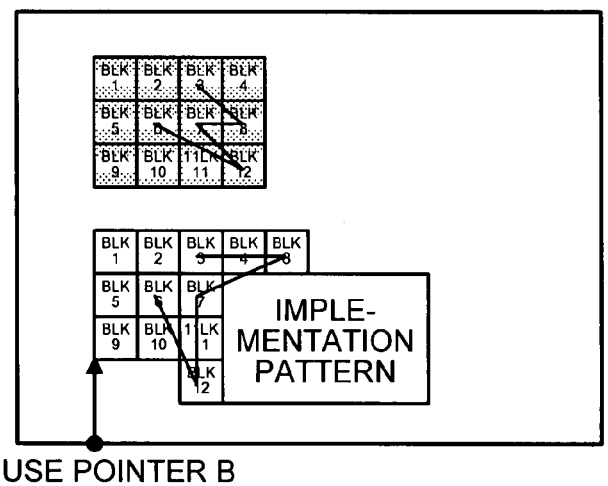

FIGS. 15B-1 to 15B-3 are diagrams for explaining an outline of how to arrange implementation patterns corresponding to the second feature of the present invention shown in FIG. 2. When the existing implementation pattern is already arranged, as shown in FIG. 15B-1, one logical group is selected from the match/similar logical groups visually displayed in the form of the list in GUI of the display unit 110 in the IC design support apparatus, and one implementation pattern consisting of the cells BLK 1 to BLK 12 corresponding to the selected logical group is arranged as a firstly arranged implementation pattern. In this case, the firstly arranged implementation pattern is not deformed from its original shape because the area of the firstly arranged implementation pattern does not overlap that of the existing implementation pattern.

Further, as shown in FIG. 15B-2, one implementation pattern consisting of the cells BLK 1 to BLK 12 is arranged as a secondly arranged implementation pattern, with the mouse pointer at the position A. In this case, the secondly arranged implementation pattern overlaps the area of the existing implementation pattern. Therefore, the secondly arranged implementation pattern is deformed from its original shape to a shape such that the area overlapping the existing implementation pattern is avoided.

Furthermore, as shown in FIG. 15B-3, the layout location of the secondly arranged implementation pattern is moved by dragging the mouse pointer to the position B. In this case, the secondly arranged implementation pattern is moved to another location, but still overlaps the area of the existing implementation pattern. However, because the overlapping area is different from that as shown in FIG. 15B-2, the shape of the secondly arranged implementation pattern is further dynamically deformed to a shape such that the area overlapping the existing implementation pattern is avoided.

When the layout location of the already-arranged implementation pattern is moved by mouse dragging or the like in this manner, the shape of the implementation pattern is dynamically deformed allowing for layout space and wiring efficiency so as to avoid the overlapping areas of the existing and the already-arranged implementation pattern in the moved layout location. When the mouse drag is released by pressing and releasing click button, then the deformation is determined. In this manner, it is possible to flexibly arrange the implementation patterns while always checking the shape of the implementation patterns, and this enables to improve the operability for arranging the implementation patterns in the implementation drawing.

According to the embodiment, in the design of the IC such as LSI that handles an enormous number of cells to be arranged, it is possible to reduce operating steps for manually adjusting the layout of the cells, and to efficiently perform the layout while easily checking logical connections.

The processes explained in the above embodiment can be implemented by executing previously prepared programs by a computer system such as a personal computer, a server, or a work station. The previously prepared programs may be read from a portable recording medium such as a magnetic disk or a magneto-optical disk to be executed.

As can be seen, the embodiment of the present invention is explained above, but the present invention is not limited thereto. Therefore, the present invention may be executed in different embodiments without departing from the technological idea described in the scope of the present invention. The effect explained in the embodiment is not limited thereto.

As described above, according to an aspect of the present invention, an object to be implemented can be selected from a logical drawing while checking a connection relationship between cells. Therefore, it is possible to prevent erroneous selection of the object and to reduce steps of designing the IC. Moreover, because the logical groups are automatically classified into match/similar logical groups having those matching each other or those similar to each other, it is possible to accurately select a logical group without workloads. The implementation pattern of the logical group is automatically created, and this enables to eliminate workloads and improve work efficiency of the IC design. Furthermore, the created implementation pattern is used to allow efficient IC design.

Moreover, according to another aspect of the present invention, the same or the similar logical groups are displayed in the form of the list, which enables to easy recognize an object to be implemented and to accurately select the object, thus, achieving efficiency of the IC design.

Furthermore, according to still another aspect of the present invention, an implementation pattern can be automatically and efficiently created.

Moreover, according to still another aspect of the present invention, even when an implementation pattern cannot be arranged in the implementation drawing if its original shape is kept as it is, the implementation pattern can flexibly be arranged by deforming the shape thereof. Upon the deformation, the wiring capability of the implementation pattern is considered. Thus, the wiring length is made efficient.

Furthermore, according to still another aspect of the present invention, the layout location of even an already-arranged implementation pattern can be changed by an operation. For the changing of the layout location, the implementation pattern, which cannot be arranged in the implementation drawing if its original shape is kept as it is, can flexibly arranged by deforming the shape thereof. Upon the deformation, the wiring capability of the implementation pattern is considered. Thus, the wiring length is made efficient.

Although the invention has been described with respect to a specific embodiment for a complete and clear disclosure, the appended claims are not to be thus limited but are to be construed as embodying all modifications and alternative constructions that may occur to one skilled in the art that fairly fall within the basic teaching herein set forth.

What is claimed is:

1. A non-transitory computer-readable recording medium that stores therein a computer program for supporting a design of an implementation drawing of an integrated circuit based on a logical drawing in which a cell is included in units of logical page, the computer program causing a computer to execute:

creating a logical group from the cell included in a selected range of the logical drawing that is specified in the logical page;

extracting a same logical group and a similar logical group as a typical group by determining whether logical drawings of created logical groups are same or similar to each other; and creating an implementation pattern of a logical group included in extracted same logical group and extracted similar logical group.

2. The non-transitory computer-readable recording medium according to claim 1, wherein the computer program further causes the computer to execute hierarchizing cells included in the created logical group allowing for an order of mutual connection of the cells.

3. The non-transitory computer-readable recording medium according to claim 1, wherein the computer program further causes the computer to execute displaying the extracted same logical group and the extracted similar logical group in a form of list by specifying the logical drawing.

4. The non-transitory computer-readable recording medium according to claim 1, wherein the creating includes creating the implementation pattern of the logical group based on a manual instruction.

5. The non-transitory computer-readable recording medium according to claim 1, wherein the creating includes creating the implementation pattern of the logical group based on a layout space of the cells and wiring capability between the cells.

6. The non-transitory computer-readable recording medium according to claim 5, wherein the creating further includes creating a modified pattern of created implementation pattern of the logical group based on a symmetrical movement or a rotational movement.

7. The non-transitory computer-readable recording medium according to claim 5, wherein the creating further includes creating a modified pattern of created implementation pattern of the logical group based on a symmetrical movement or a rotational movement for each cell included in the implementation pattern.

8. The non-transitory computer-readable recording medium according to claim 1, wherein the computer program further causes the computer to execute arranging an implementation pattern of a logical group selected from the same logical group and the similar logical group in the implementation drawing based on a manual instruction.

9. The non-transitory computer-readable recording medium according to claim 1, wherein the computer program further causes the computer to execute arranging an implementation pattern of a logical group selected from the same logical group and the similar logical group in the implementation drawing, by deforming a pattern shape of the implementation based on a specified location in layout, a layout location of an implementation pattern of another arranged logical group, and wiring capability of an implementation pattern to be arranged.

10. The non-transitory computer-readable recording medium according to claim 9, wherein the computer program further causes the computer to execute moving a pattern shape of an implementation pattern arranged in the implementation drawing by deforming the pattern shape based on a specified destination location, a layout location of an implementation pattern of another arranged logical group, and wiring capability of the implementation pattern to be arranged.

11. The non-transitory computer-readable recording medium according to claim 1, wherein the computer program further causes the computer to execute storing the created logical group in an external storage of the computer.

12. The non-transitory computer-readable recording medium according to claim 1, wherein the computer program further causes the computer to execute storing created implementation pattern in an external storage of the computer.

13. An apparatus for supporting a design of an implementation drawing of an integrated circuit based on a logical drawing in which a cell is included in units of logical page, the apparatus comprising:

a logical-group creating unit that creates a logical group from the cell included in a selected range of the logical drawing that is specified in the logical page;

a logical-group extracting unit that extracts a same logical group and a similar logical group as a typical group by determining whether logical drawings of created logical groups are same or similar to each other; and a pattern creating unit that creates an implementation pattern of a logical group included in extracted same logical group and extracted similar logical group.

14. The apparatus according to claim 13, further comprising a list displaying unit that displays the extracted same logical group and the extracted similar logical group in a form of list by specifying the logical drawing.

15. The apparatus according to claim 13, wherein the pattern creating unit creates the implementation pattern of the logical group based on a layout space of the cells and wiring capability between the cells.

16. The apparatus according to claim 13, further comprising an arranging unit that arranges an implementation pattern of a logical group selected from the same logical group and the similar logical group in the implementation drawing, by deforming a pattern shape of the implementation based on a specified location in layout, a layout location of an implementation pattern of another arranged logical group, and wiring capability of an implementation pattern to be arranged.

17. The apparatus according to claim 16, further comprising a moving unit that moves a pattern shape of an implementation pattern arranged in the implementation drawing by deforming the pattern shape based on a specified destination location, a layout location of an implementation pattern of another arranged logical group, and wiring capability of the implementation pattern to be arranged.

18. A method of supporting a design of an implementation drawing of an integrated circuit based on a logical drawing in which a cell is included in units of logical page, the method comprising:

creating, using a processor, a logical group from the cell included in a selected range of the logical drawing that is specified in the logical page;

extracting a same logical group and a similar logical group as a typical group by determining whether logical drawings of created logical groups are same or similar to each other; and creating an implementation pattern of a logical group included in extracted same logical group and extracted similar logical group.

19. The method according to claim 18, further comprising displaying the extracted same logical group and the extracted similar logical group in a form of list by specifying the logical drawing.

20. The method according to claim 18, wherein the creating includes creating the implementation pattern of the logical group based on a layout space of the cells and wiring capability between the cells.

21. The method according to claim 18, further comprising arranging an implementation pattern of a logical group selected from the same logical group and the similar logical group in the implementation drawing, by deforming a pattern shape of the implementation based on a specified location in layout, a layout location of an implementation pattern of another arranged logical group, and wiring capability of an implementation pattern to be arranged.

22. The method according to claim 21, further comprising moving a pattern shape of an implementation pattern arranged in the implementation drawing by deforming the pattern shape based on a specified destination location, a layout location of an implementation pattern of another arranged logical group, and wiring capability of the implementation pattern to be arranged.

* * * * *